United States Patent
Takeuchi et al.

(10) Patent No.: US 6,883,215 B2
(45) Date of Patent: Apr. 26, 2005

(54) PIEZOELECTRIC/ELECTROSTRICTIVE DEVICE AND METHOD OF MANUFACTURING SAME

(75) Inventors: Yukihisa Takeuchi, Nishikamo-Gun (JP); Tsutomu Nanataki, Toyoake (JP); Koji Kimura, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/702,391

(22) Filed: Nov. 5, 2003

(65) Prior Publication Data

US 2004/0091608 A1 May 13, 2004

Related U.S. Application Data

(62) Division of application No. 10/099,671, filed on Mar. 15, 2002, now Pat. No. 6,671,939, which is a division of application No. 09/668,324, filed on Sep. 22, 2000, now Pat. No. 6,448,691.

(30) Foreign Application Priority Data

| Oct. 1, 1999 | (JP) | ............................................ 11-281522 |
| Oct. 28, 1999 | (JP) | ............................................ 11-307844 |
| Nov. 16, 1999 | (JP) | ............................................ 11-326195 |
| Dec. 27, 1999 | (JP) | ............................................ 11-371967 |
| Jan. 21, 2000 | (JP) | ..................................... 2000-013576 |
| Jan. 24, 2000 | (JP) | ..................................... 2000-015123 |
| Mar. 1, 2000 | (JP) | ..................................... 2000-056434 |
| May 11, 2000 | (JP) | ..................................... 2000-139074 |
| Sep. 13, 2000 | (JP) | ..................................... 2000-278523 |

(51) Int. Cl.$^7$ ............................................. H04R 17/00
(52) U.S. Cl. ...................... 29/25.35; 29/594; 29/830; 29/831; 29/412; 29/417; 29/896.22
(58) Field of Search ............................. 29/25.35, 594, 29/830, 831, 417, 412, 896.22; 310/324, 328, 358

(56) References Cited

U.S. PATENT DOCUMENTS

| 4,064,475 A | 12/1977 | Kouchich et al. |
| 4,290,041 A | 9/1981 | Utsumi et al. |
| 4,441,128 A | 4/1984 | Ohba et al. |

(Continued)

FOREIGN PATENT DOCUMENTS

| DE | 3021430 | 12/1980 |
| DE | 3424005 | 1/1986 |
| EP | 0667646 | 8/1995 |

(Continued)

OTHER PUBLICATIONS

Yoshikazu Soeno, et al., "Piezoelectric Piggy–Back Microactuator for Hard Disk Drive." IEEE Transactions on Magnetics, vol. 35, No. 2, Mar. 1999, pp 983–987.

S. Koganezawa, et al., "Dual–Stage Actuator System for Magnetic Disk Drives Using a Shear Mode Piezoelectric Microactuator." IEEE Transactions on Magnetics, vol. 35, No. 2, Mar. 1999, pp 998–992.

Primary Examiner—A. Dexter Tugbang
Assistant Examiner—Tai Van Nguyen
(74) Attorney, Agent, or Firm—Burr & Brown

(57) ABSTRACT

A piezoelectric/electrostrictive device includes a pair of mutually opposing thin plate sections, a movable section, and a fixation section for supporting the thin plate sections and the movable section. One or more piezoelectric/electrostrictive elements are arranged on the pair of thin plate sections. A hole is formed by both inner walls of the pair of thin plate sections, an inner wall of the movable section, and an inner wall of the fixation section. At least one thin plate section of the pair of thin plate sections is previously bent in a direction to make mutual approach so that it has an inwardly convex configuration to the hole.

7 Claims, 32 Drawing Sheets

U.S. PATENT DOCUMENTS

| | | | |
|---|---|---|---|
| 4,713,573 A | | 12/1987 | Gansert et al. |
| 4,825,227 A | * | 4/1989 | Fischbeck et al. ............. 347/69 |
| 5,063,321 A | | 11/1991 | Carter |
| 5,475,279 A | * | 12/1995 | Takeuchi et al. ............. 310/331 |
| 5,534,092 A | | 7/1996 | Ogawa et al. |
| 5,572,052 A | | 11/1996 | Kashihara et al. |
| 5,600,197 A | * | 2/1997 | Takeuchi et al. ............. 310/328 |
| 5,691,594 A | | 11/1997 | Takeuchi et al. |
| 5,693,997 A | | 12/1997 | Griffith et al. |
| 5,891,577 A | | 4/1999 | Breitbach et al. |
| 5,912,524 A | | 6/1999 | Ohnishi et al. |
| 5,940,947 A | * | 8/1999 | Takeuchi et al. ........... 29/25.35 |
| 5,969,248 A | | 10/1999 | Kurachi et al. |
| 6,049,158 A | * | 4/2000 | Takeuchi et al. ............. 310/328 |
| 6,109,104 A | | 8/2000 | Fukuda et al. |
| 6,140,739 A | | 10/2000 | Arai et al. |
| 6,262,516 B1 | | 7/2001 | Fukuda et al. |
| 6,323,582 B1 | | 11/2001 | Takeuchi et al. |
| 6,329,740 B1 | | 12/2001 | Hirota et al. |
| 6,333,681 B1 | | 12/2001 | Takeuchi et al. |
| 6,335,586 B1 | | 1/2002 | Takeuchi et al. |
| 6,342,751 B1 | | 1/2002 | Takeuchi et al. |
| 6,351,056 B1 | | 2/2002 | Takeuchi et al. |
| 6,396,193 B1 | | 5/2002 | Takeuchi et al. |
| 6,404,109 B1 | | 6/2002 | Takeuchi et al. |
| 6,452,309 B1 | | 9/2002 | Takeuchi et al. |
| 6,472,799 B2 | | 10/2002 | Takeuchi et al. |
| 6,476,539 B1 | | 11/2002 | Takeuchi et al. |
| 6,498,419 B1 | | 12/2002 | Takeuchi et al. |
| 6,538,362 B1 | | 3/2003 | Takeuchi et al. |
| 6,566,789 B2 | | 5/2003 | Takeuchi et al. |
| 6,570,297 B1 | | 5/2003 | Takeuchi et al. |
| 6,643,902 B2 | | 11/2003 | Takeuchi et al. |
| 2002/0010990 A1 | | 1/2002 | Takeuchi et al. |
| 2002/0013987 A1 | | 2/2002 | Hirota et al. |
| 2002/0017014 A1 | | 2/2002 | Takeuchi et al. |
| 2002/0190609 A1 | | 12/2002 | Takeuchi et al. |

FOREIGN PATENT DOCUMENTS

| | | |
|---|---|---|
| EP | 0667647 | 8/1995 |
| EP | 1 017 116 A2 | 7/2000 |
| EP | 1020937 | 7/2000 |
| EP | 1 089 351 A2 | 4/2001 |
| EP | 1 089 352 A2 | 4/2001 |
| EP | 1 089 356 A2 | 4/2001 |
| EP | 1 089 358 A2 | 4/2001 |
| GB | 789336 | 1/1958 |
| JP | 63-64640 | 3/1988 |
| JP | 02-119278 | 5/1990 |
| JP | 10-136665 | 5/1998 |
| JP | 11-051959 | 2/1999 |
| WO | 99/01901 | 1/1999 |
| WO | 01/26166 A1 | 4/2001 |
| WO | 01/26169 A1 | 4/2001 |

* cited by examiner

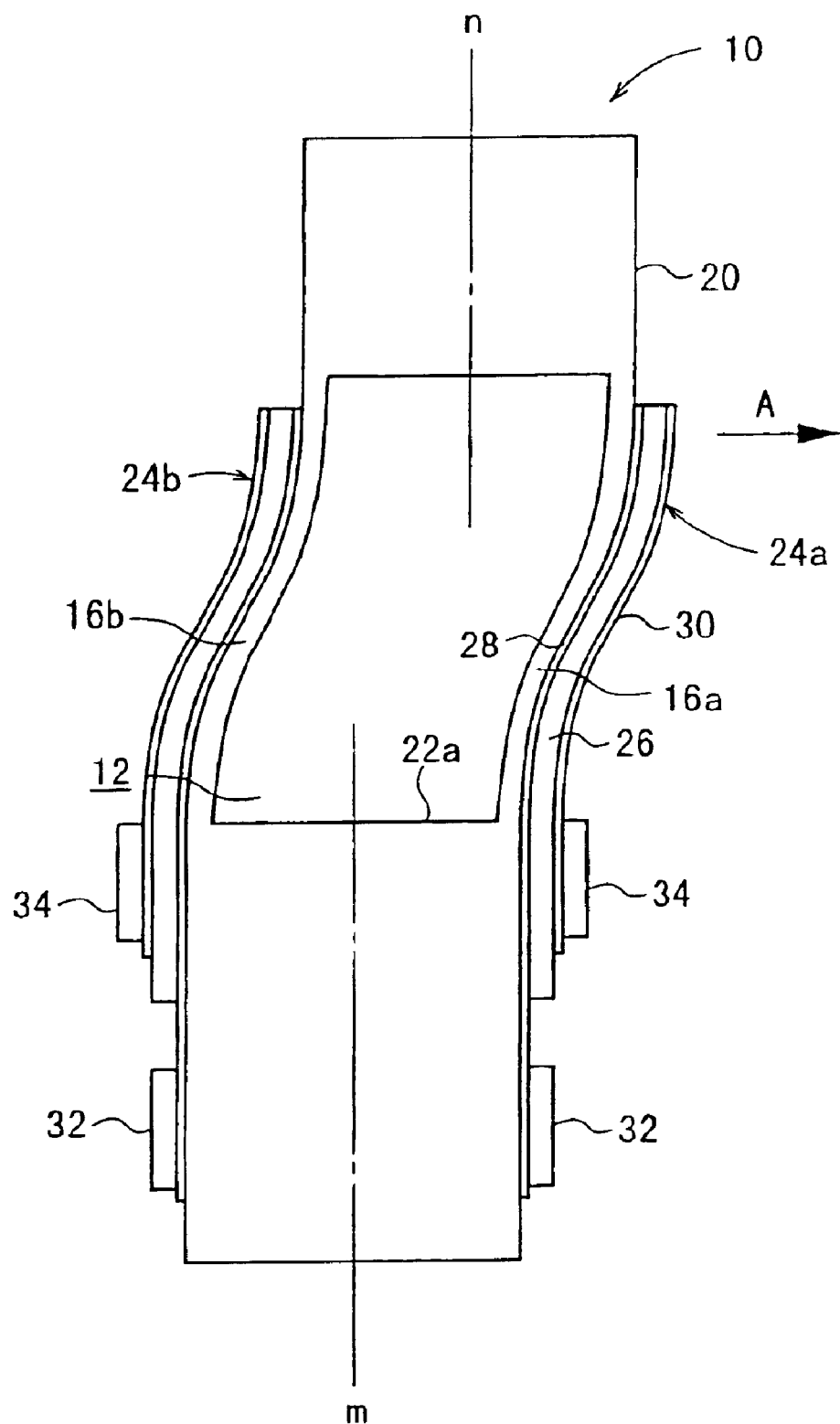

PIEZOELECTRIC/ELECTROSTRICTIVE DEVICE AND METHOD OF MANUFACTURING SAME

CROSS REFERENCE TO RELATED APPLICATIONS

This application is a division of U.S. patent application Ser. No. 10/099,671, filed Mar. 15, 2002, now U.S. Pat. No. 6,671,939 which is a division of U.S. patent application Ser. No. 09/668,324, filed Sep. 22, 2000, now U.S. Pat. No. 6,448,691, the entireties of which are incorporated herein by reference.

BACKGROUND OF THE INVENTION

1. Field of the Invention

The present invention relates to a piezoelectric/electrostrictive device which is provided with a movable section to be operated on the basis of a displacement action of a piezoelectric/electrostrictive element, or a piezoelectric/electrostrictive device which is capable of detecting displacement of a movable section by the aid of a piezoelectric/electrostrictive element, and a method for producing the same. In particular, the present invention relates to a piezoelectric/electrostrictive device which is excellent in strength, shock resistance, and moisture resistance and which makes it possible to efficiently operate a movable section to a great extent, and a method for producing the same.

2. Description of the Related Art

Recently, a displacement element, which makes it possible to adjust the optical path length and the position in an order of submicron, is required, for example, in the fields of the optics, the magnetic recording, and the precision machining. Development is advanced for the displacement element based on the use of the displacement brought about by the inverse piezoelectric effect or the electrostrictive effect caused when a voltage is applied to a piezoelectric/electrostrictive material (for example, a ferroelectric material).

As shown in FIG. 32, for example, those hitherto disclosed as such a displacement element include a piezoelectric actuator comprising a fixation section 204, a movable section 206, and a beam section 208 for supporting them which are formed in an integrated manner with a hole 202 provided through a plate-shaped member 200 composed of a piezoelectric/electrostrictive material and with an electrode layer 210 provided on the beam section 208 (see, for example, Japanese Laid-Open Patent Publication No. 10-136665).

The piezoelectric actuator is operated such that when a voltage is applied to the electrode layer 210, the beam section 208 makes expansion and contraction in a direction along a line obtained by connecting the fixation section 204 and the movable section 206 in accordance with the inverse piezoelectric effect or the electrostrictive effect. Therefore, the movable section 206 can perform circular arc-shaped displacement or rotational displacement in the plane of the plate-shaped member 200.

On the other hand, Japanese Laid-Open Patent Publication No. 63-64640 discloses a technique in relation to an actuator based on the use of a bimorph. In this technique, electrodes for the bimorph are provided in a divided manner. The actuator is driven due to the selection of the divided electrodes, and thus the highly accurate positioning is performed at a high speed. This patent document discloses a structure especially in FIG. 4 in which, for example, two bimorphs are used in an opposed manner.

However, the piezoelectric actuator described above involves such a problem that the amount of operation of the movable section is small, because the displacement in the direction of extension and contraction of the piezoelectric/electrostrictive material (i.e., in the in-plane direction of the plate-shaped member) is transmitted to the movable section as it is.

All of the parts of the piezoelectric actuator are made of the piezoelectric/electrostrictive material which is a fragile material having a relatively heavy weight. Therefore, the following problems arise. That is, the mechanical strength is low, and the piezoelectric actuator is inferior in handling performance, shock resistance, and moisture resistance. Further, the piezoelectric actuator itself is heavy, and its operation tends to be affected by harmful vibrations (for example, residual vibration and noise vibration during high speed operation).

In order to solve the problems described above, it has been suggested that the hole is filled with a filler material having flexibility. However, it is clear that the amount of displacement, which is brought about by the inverse piezoelectric effect or the electrostrictive effect, is decreased even when the filler material is merely used.

On the other hand, the following structure is disclosed in FIG. 4 in Japanese Laid-Open Patent Publication No. 63-64640. That is, in a joined form between a mediating member and a bimorph and between a head and the bimorph, so-called piezoelectric operating sections, both of which cause the strain, extend over respective joined portions. In other words, the bimorph is formed continuously ranging from the mediating member to the head.

As a result, when the bimorph is operated, the displacement action, which is effected with the supporting point of the joined portion between the mediating member and the bimorph, mutually interferes with the displacement action which is effected with the supporting point of the joined point between the head and the bimorph. The expression of the displacement is inhibited. In this structure, it is impossible to obtain such a function that the head is greatly displaced with respect to the external space.

The conventional device of this type involves a problem that in order to displace sufficiently the movable section, a large amount of voltage must be applied.

SUMMARY OF THE INVENTION

The present invention has been made taking the foregoing problems into consideration, an object of which is to provide a piezoelectric/electrostrictive device and a method for producing the same which make it possible to obtain a displacement element that is scarcely affected by harmful vibration during operation and capable of high speed response with high mechanical strength while being excellent in handling performance, shock resistance, and moisture resistance, which is liable to cause the displacement in a specific axis direction and can increase the displacement amount of a movable section while keeping a voltage applied to a piezoelectric/electrostrictive element at a low level, as well as a sensor element that makes it possible to detect vibration of the movable section with good accuracy and high sensitivity.

According to the present invention, there is provided a piezoelectric/electrostrictive device comprising a pair of mutually opposing thin plate sections, a movable section, and a fixation section for supporting the thin plate sections and the movable section; one or more piezoelectric/ electrostrictive elements arranged on at least one thin plate section of the pair of thin plate sections; and a hole formed by both inner walls of the pair of thin plate sections, an inner wall of the movable section, and an inner wall of the fixation section; wherein at least one thin-plate section of the pair of thin plate sections is previously bent in a direction to make mutual approach.

According to another aspect of the present invention, there is provided a piezoelectric/electrostrictive device as described above, wherein the pair of thin plate sections are previously bent in directions to make mutual approach. In this arrangement, it is also preferable that at least one thin plate section of the pair of thin plate sections, or the pair of thin plate sections are previously bent inwardly in convex configurations.

Usually, a thin plate section is bent as a voltage is applied to a piezoelectric/electrostrictive element, whereby a movable section causes displacement. In the present invention, since the pair of thin plate sections are previously bent in directions to make mutual approach and deformed in a direction substantially the same as bending directions of the thin plate sections due to the action of the piezoelectric/ electrostrictive element, the thin plate sections are bent by a relatively small force, whereby the movable section causes displacement. Namely, in the present invention, as compared with the conventional piezoelectric/electrostrictive devices, equivalent displacement (displacement in the movable section) can be obtained with a low voltage, whereby an electric power consumption of electronic instruments installed with the piezoelectric/electrostrictive device can be reduced.

Further, the structure in which the thin plate sections are previously bent inwardly in convex configurations is a structure in which not only a high resistance is exhibited against an external force from the width direction of the thin plate section, but also the structure itself is liable to cause displacement in a specific axis direction of each movable section, i.e., in a uniaxial direction along which each thin plate section opposes to the other. Accordingly, this structure has a characteristic that the movable section is hardly rotated in an arc or rotational state, thereby making it possible to displace in an external space to a great extent.

It is preferable that $0<\delta \leqq 0.13L$ is satisfied provided that a bent amount (previously bent amount) of the thin plate section is $\delta$, and a length of the thin plate section (distance between the inner walls of the movable section and the fixation section) is L. When the bent amount is set to be within the range described above, the displacement of the piezoelectric/electrostrictive element can be utilized as the displacement of the movable section more efficiently. As a result, the movable section can be displaced to a great extent.

The movable section, the fixation section, and the thin plate section may be made of ceramics or metal. Alternatively, each of the components may be made of a ceramic material, or each of them may be made of a metal material. Further, each of the components may be constructed to have a hybrid structure obtained by combining those produced from materials of ceramics and metal.

In the arrangement described above, it is also preferable that the thin plate section, the movable section, and the fixation section are composed of a ceramic substrate integrated into one unit by simultaneously sintering a ceramic green laminate and cutting off unnecessary portions. It is also preferable that the piezoelectric/electrostrictive element has a film-shaped configuration, and at least any one of the pair of electrodes and/or a piezoelectric/electrostrictive layer is integrated with the ceramic substrate by means of sintering.

In this arrangement, the piezoelectric/electrostrictive element may have a piezoelectric/electrostrictive layer and a pair of electrodes formed on the piezoelectric/ electrostrictive layer. It is also preferable that the piezoelectric/electrostrictive element has a piezoelectric/ electrostrictive layer and a pair of electrodes formed on both sides of the piezoelectric/electrostrictive layer, and one electrode of the pair of electrodes is formed on at least the thin plate section. In this arrangement, the vibration caused by the piezoelectric/electrostrictive element can be efficiently transmitted via the thin plate section to the movable section or the fixation section. Thus, it is possible to improve the response performance. Especially, it is preferable that the piezoelectric/electrostrictive element is constructed in a stacked form comprising a plurality of the piezoelectric/ electrostrictive layers and the electrodes.

When the arrangement as described above is adopted, the following feature is achieved. That is, the generated force of the piezoelectric/electrostrictive element is increased, and thus it is possible to obtain large displacement. Further, it is possible to obtain a high resonance frequency owing to the increase in rigidity of the device itself, making it easy to achieve the high speed of the displacement action. Further, it is also preferable that the hole is filled with a gel material.

According to still another aspect of the present invention, there is provided a method for producing a piezoelectric/ electrostrictive device comprising a pair of mutually opposing thin plate sections, a movable section, and a fixation section for supporting the thin plate sections and the movable section; one or more piezoelectric/electrostrictive elements arranged on at least one thin plate section of the pair of thin plate sections; and a hole formed by both inner walls of the pair of thin plate sections, an inner wall of the movable section, and an inner wall of the fixation section; the method comprising the step of cutting off a predetermined portion after forming the piezoelectric/electrostrictive element on at least the thin plate section to produce the piezoelectric/electrostrictive device in which at least one thin plate section of the pair of thin plate sections is bent in a direction to make mutual approach.

According to still another aspect of the present invention, there is provided a production method as described above, comprising the step of cutting off a predetermined portion after forming the piezoelectric/electrostrictive element on at least the thin plate section to produce the piezoelectric/ electrostrictive device in which the pair of thin plate sections are previously bent in directions to make mutual approach.

The phrase "after producing the piezoelectric/ electrostrictive element" referred to herein indicates a state in which at least the piezoelectric/electrostrictive layer is formed. As for the electrode to be formed after the formation of the piezoelectric/electrostrictive layer, the electrode may be formed after performing the cutoff.

According to still another aspect of the present invention, there is provided a production method as described above, comprising the steps of integrally sintering a ceramic green laminate including at least a first ceramic green sheet having a window for forming at least the hole thereafter and second ceramic green sheets to be formed into the thin plate sections thereafter to produce a ceramic laminate including portions to be formed into the thin plate sections thereafter denting inwardly; forming the piezoelectric/electrostrictive element on at least an outer surface of a portion of the ceramic laminate to be formed into the thin plate section; and producing a ceramic substrate formed with at least the piezoelectric/electrostrictive element in which the pair of thin plate sections are bent in directions to make mutual approach, by means of at least one time of cutoff treatment for the ceramic laminate formed with the piezoelectric/electrostrictive element. In this process, it is preferable that those having a difference in sintering shrinkage speed and/or sintering shrinkage amount are used for the first and second ceramic green sheets respectively.

It is also preferable that the step of forming the piezoelectric/electrostrictive element is performed in accordance with a film formation method; and any one of a pair of electrodes and/or a piezoelectric/electrostrictive layer is integrated by sintering with at least the outer surface of the portion to be formed into the thin plate section.

According to the production method described above, it is possible to produce effectively and easily a piezoelectric/electrostrictive device capable of displacing a movable section to a great extent while keeping a voltage of a piezoelectric/electrostrictive element at a low level. Also, it is possible to mass-produce the piezoelectric/electrostrictive device having high performance.

According to still another aspect of the present invention, there is provided a method for producing the piezoelectric/electrostrictive device as described above, comprising the steps of integrally sintering a ceramic green laminate including at least a first ceramic green sheet having a window for forming at least the hole thereafter and second ceramic green sheets to be formed into the thin plate sections thereafter to produce a ceramic laminate; forming a precursor of one of a pair of electrodes constituting the piezoelectric/electrostrictive element and/or a piezoelectric/electrostrictive layer on at least an outer surface of a portion of the ceramic laminate to be formed into the thin plate section; sintering the precursor to integrate the ceramic laminate with the precursor and simultaneously denting inwardly a portion to be formed into the thin plate section thereafter; and producing a ceramic substrate formed with at least the piezoelectric/electrostrictive element in which the pair of thin plate sections are bent in directions to make mutual approach, by means of at least one time of cutoff treatment for the ceramic laminate formed.

The step of forming the precursor of one of at least the pair of electrodes constituting the piezoelectric/electrostrictive element and/or piezoelectric/electrostrictive layer may be carried out by a film formation method. In this case, it is preferable that the precursor is formed while controlling a difference in thermal expansion at least between a material for the portion to be formed into the thin plate section and a material of precursor when the precursor is formed on the ceramic laminate.

Accordingly, when the ceramic green laminate and the precursor are sintered, the portion to be formed into the thin plate section thereafter of the ceramic laminate is dented owing to the difference in thermal expansion at least between the material for the portion to be formed into the thin plate section and the material for the precursor, and the piezoelectric/electrostrictive element is consequently formed on the portion to be formed into the thin plate section.

According to still another aspect of the present invention, there is provided a method for producing the piezoelectric/electrostrictive device as described above, preferably comprising the steps of producing a ceramic green laminate including at least a ceramic green sheet having a window for forming at least the hole thereafter and ceramic green sheets to be formed into the thin plate sections thereafter; forming a precursor for constructing at least a part of the piezoelectric/electrostrictive element on at least an outer surface of a portion to be formed into the thin plate section, of the ceramic green laminate; co-firing the ceramic green laminate and the precursor for constructing at least the part or all of the piezoelectric/electrostrictive element so that a ceramic laminate including portions to be formed into the thin plate sections thereafter denting inwardly is produced, and at least the part or all of the piezoelectric/electrostrictive element is formed on at least the outer surface of the portion to be formed into the thin plate section; and producing a ceramic substrate in which the pair of thin plate sections are bent in directions to make mutual approach, by means of at least one time of cutoff treatment for the ceramic laminate.

In this process, it is preferable that the precursor is formed while controlling a difference in thermal expansion at least between a material for the portion to be formed into the thin plate section and a material for the precursor of the piezoelectric/electrostrictive element when the precursor for constructing at least the part of the piezoelectric/electrostrictive element is formed on the ceramic green laminate. Accordingly, when the ceramic green laminate and the precursor for constructing at least the part or all of the piezoelectric/electrostrictive element are sintered, then the portion to be formed into the thin plate section thereafter of the ceramic laminate is dented owing to the difference in thermal expansion at least between the material for the portion to be formed into the thin plate section and the material for the precursor for constructing at least the part of the piezoelectric/electrostrictive element, and the piezoelectric/electrostrictive element is consequently formed on the portion to be formed into the thin plate section.

It is also preferable that the production methods described above further comprise exposing the hole by means of a cutoff treatment for the ceramic laminate in a combined manner.

Therefore, the piezoelectric/electrostrictive device according to the present invention can be utilized as the active device including, for example, various transducers, various actuators, frequency region functional parts (filters), transformers, vibrators, resonators, oscillators, and discriminators for the communication and the power generation, as well as the sensor element for various sensors including, for example, ultrasonic sensors, acceleration sensors, angular velocity sensors, shock sensors, and mass sensors. Especially, the piezoelectric/electrostrictive device according to the present invention can be preferably utilized for various actuators to be used for the mechanism for adjusting the displacement and the positioning and for adjusting the angle for various precision parts such as those of optical instruments and precision mechanical equipments.

The above and other objects, features, and advantages of the present invention will become more apparent from the following description when taken in conjunction with the accompanying drawings in which a preferred embodiment of the present invention is shown by way of illustrative example.

BRIEF DESCRIPTION OF THE DRAWINGS

FIG. 15 illustrates a situation in which the piezoelectric/electrostrictive element makes the displacement action in the piezoelectric/electrostrictive device according to the embodiment of the present invention;

DETAILED DESCRIPTION OF THE INVENTION

Explanation will be made below with reference to FIGS. 1 to 31 for illustrative embodiments of the piezoelectric/electrostrictive device and the production method for the same according to the present invention.

It is noted that the piezoelectric/electrostrictive device resides in a concept which includes the element for mutually converting the electric energy and the mechanical energy by the aid of the piezoelectric/electrostrictive element. Therefore, the piezoelectric/electrostrictive device is most preferably used as the active element such as various actuators and vibrators, especially as the displacement element based on the use of the displacement brought about by the inverse piezoelectric effect or the electrostrictive effect. Additionally, the piezoelectric/electrostrictive device is also preferably used as the passive element such as acceleration sensor elements and shock sensor elements.

In this connection, the piezoelectric/electrostrictive device and the piezoelectric/electrostrictive element mean a piezoelectric and/or electrostrictive device and a piezoelectric and/or electrostrictive element, respectively.

Figure 1:
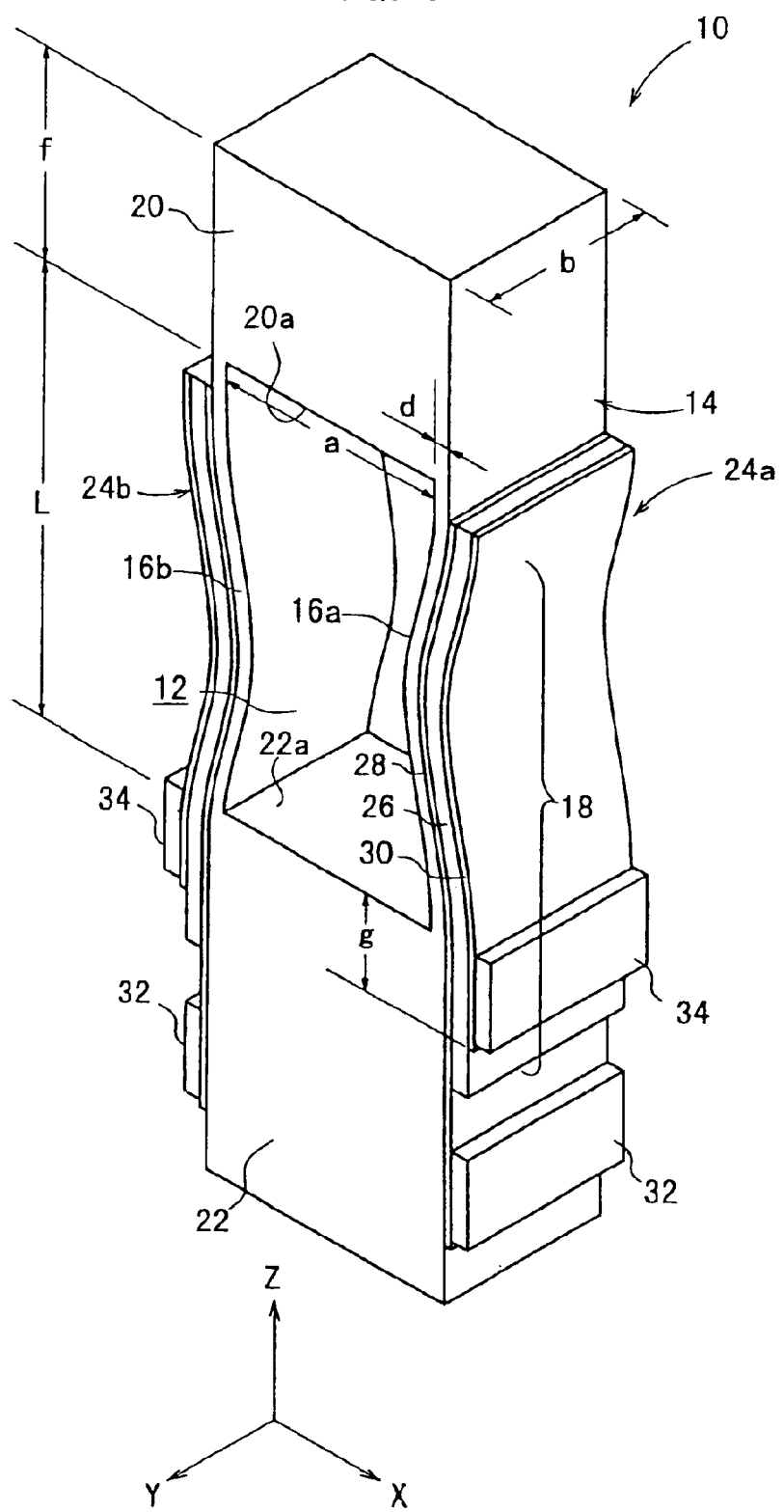
FIG. 1 shows a perspective view illustrating an arrangement of a piezoelectric/electrostrictive device according to an embodiment of the present invention.
Figure 2:
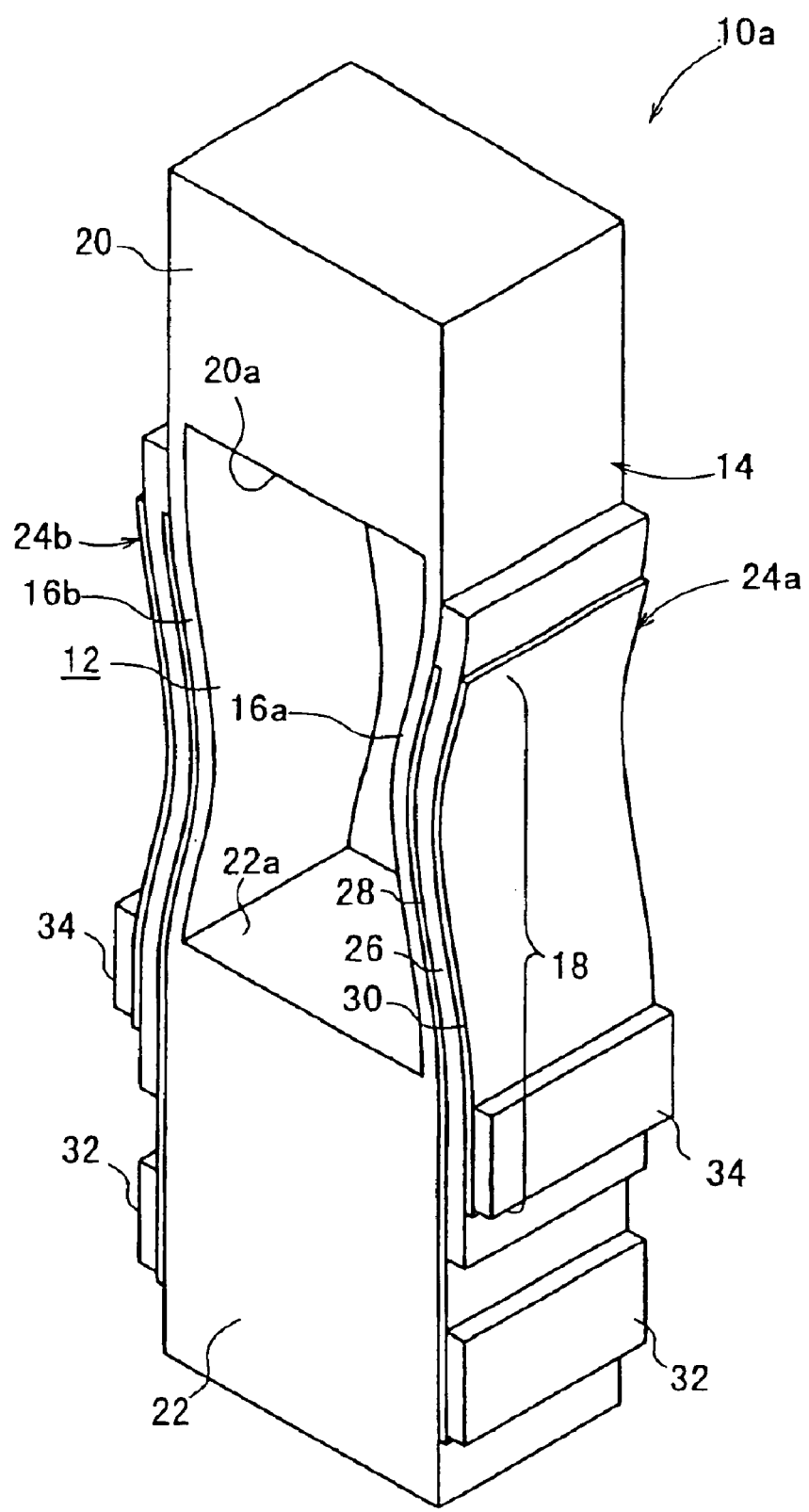
FIG. 2 shows a perspective view illustrating an arrangement of a piezoelectric/electrostrictive device according to a first modified embodiment.
Figure 3:
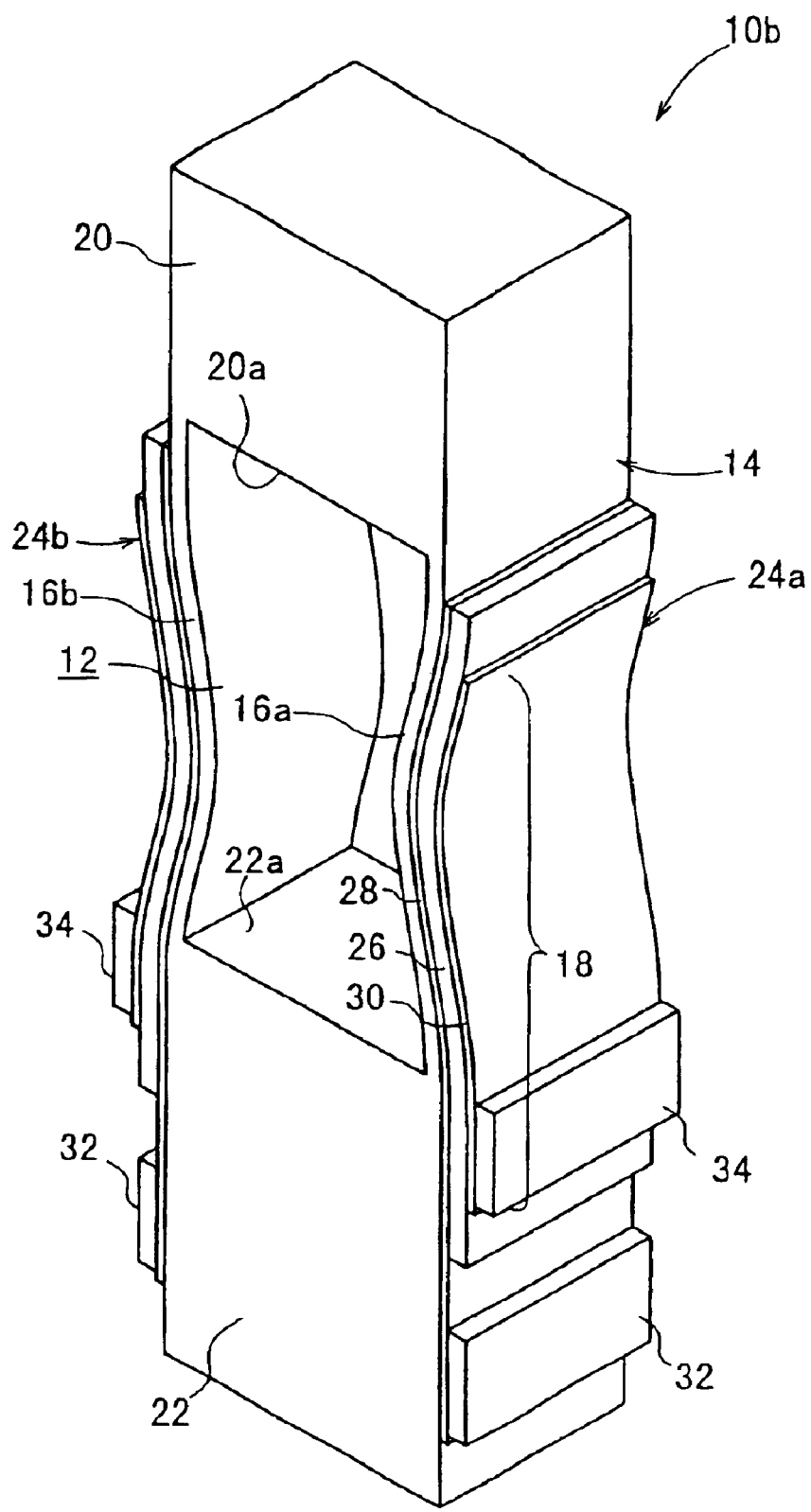
FIG. 3 shows a perspective view illustrating an arrangement of a piezoelectric/electrostrictive device according to a second modified embodiment.

As shown in FIG. 1, the piezoelectric/electrostrictive device 10 according to this embodiment has a substrate 14 which has a lengthy rectangular parallelepiped-shaped configuration as a whole and which has a hole 12 provided at an approximately central portion in the major axis direction thereof.

The substrate 14 comprises a pair of mutually opposing thin plate sections 16a, 16b, a movable section 20, and a fixation section 22 for supporting the pair of thin plate sections 16a, 16b and the movable section 20.

Piezoelectric/electrostrictive elements 24a, 24b are formed at respective parts of at least the thin plate sections 16a, 16b respectively.

Those usable as the substrate 14 include a structure comprising ceramics or metal as a whole, and a hybrid structure obtained by combining products produced with materials of ceramics and metal.

Those adaptable for the substrate 14 include, for example, a structure in which respective parts are bonded to one another with an adhesive such as organic resin or glass or the like, a ceramic integrated structure which is obtained by sintering and integrating a ceramic green laminate into one unit, and a metal integrated structure integrated by brazing, soldering, eutectic bonding, or welding into one unit. Preferably, it is desirable to construct the substrate 14 with a ceramic laminate integrated into one unit by sintering a ceramic green laminate.

The time-dependent change of state scarcely occurs in the integrated product of ceramic, because no adhesive exists at joined portions between the respective parts. Therefore, the reliability of the joined portion is high, giving a structure which is advantageous to ensure the rigidity. Additionally, the integrated product of ceramic can be produced with ease by means of the method for laminating ceramic green sheets as described later on.

The piezoelectric/electrostrictive elements 24a, 24b are prepared as separate members as described later on, and the prepared piezoelectric/electrostrictive elements 24a, 24b are affixed to the substrate 14 with an adhesive such as organic resin or glass or by means of brazing, soldering, or eutectic bonding. Alternatively, the piezoelectric/electrostrictive elements 24a, 24b are directly formed on the substrate 14 by using the film formation method not by using the adhesive method described above.

The piezoelectric/electrostrictive device 10 includes the hole 12 having, for example, a rectangular configuration which is formed by both inner walls of the pair of thin plate sections 16a, 16b, an inner wall 20a of the movable section 20, and an inner wall 22a of the fixation section 22. The piezoelectric/electrostrictive device 10 is constructed such that the movable section 20 is displaced in accordance with the driving of the piezoelectric/electrostrictive element or elements 24a and/or 24b, or the displacement of the movable section 20 is detected by the piezoelectric/electrostrictive element or elements 24a and/or 24b.

Each of the piezoelectric/electrostrictive elements 24a, 24b comprises a piezoelectric/electrostrictive layer 26, and a pair of electrodes 28, 30 formed on both sides of the piezoelectric/electrostrictive layer 26. One electrode 28 of the pair of electrodes 28, 30 is formed at least on each of the pair of thin plate sections 16a, 16b.

In the embodiment shown in FIG. 1, respective forward end surfaces of the pair of electrodes 28, 30 and the piezoelectric/electrostrictive layer 26 for constructing the piezoelectric/electrostrictive elements 24a, 24b are substantially aligned. A substantial driving portion 18 of the piezoelectric/electrostrictive elements 24a, 24b (portion at which the pair of electrodes 28, 30 are overlapped with each other with the piezoelectric/electrostrictive layer 26 interposed therebetween) is continuously formed over a range from a part of the outer circumferential surface of the fixation section 22 to a part of the outer circumferential surface of the thin plate section 16a, 16b. Especially, in this embodiment, the respective forward end surfaces of the pair of electrodes 28, 30 are located at the positions slightly deviated rearwardly from the inner wall 20a of the movable section 20. Of course, the piezoelectric/electrostrictive elements 24a, 24b may be formed such that the substantial driving portion 18 is located over a range from a part of the movable section 20 to a part of the thin plate sections 16a, 16b.

The voltage is applied to the pair of electrodes 28, 30 via terminals (pads) 32, 34 of the respective electrodes 28, 30 formed on the both side surfaces (element formation surfaces) of the fixation section 22 respectively. The respective terminals 32, 34 are positioned as follows. That is, the terminal 32 corresponding to the first electrode 28 is formed at the position deviated toward the rearward end of the fixation section 22. The terminal 34 corresponding to the second electrode 30 disposed on the side of the external space is formed at the position deviated toward the inner wall 22a of the fixation section 22.

In this embodiment, the piezoelectric/electrostrictive device 10 can be individually fixed by utilizing the surfaces respectively different from the surfaces on which the terminals 32, 34 are arranged. As a result, it is possible to obtain the high reliability for both of the fixation of the piezoelectric/electrostrictive device 10 and the electric connection between the circuit and the terminals 32, 34. In this arrangement, the electric connection between the terminals 32, 34 and the circuit is made, for example, by means of the flexible print-circuit (also referred to as FPC), the flexible flat cable (also referred to as FFC), and the wire bonding.

Structures other than the structure shown in FIG. 1 are available for the piezoelectric/electrostrictive elements 24a, 24b. That is, as in a piezoelectric/electrostrictive device 10a according to a first modified embodiment shown in FIG. 2, it is also preferable that the respective forward ends of the pair of electrodes 28, 30 for constructing the piezoelectric/electrostrictive elements 24a, 24b are aligned, and only the forward end of the piezoelectric/electrostrictive layer 26 is allowed to protrude toward the movable section 20. Alternatively, as in a piezoelectric/electrostrictive device 10b according to a second modified embodiment shown in FIG. 3, it is also preferable that the respective forward ends of the first electrode 28 and the piezoelectric/electrostrictive layer 26 are aligned, and only the forward end of the second electrode 30 is disposed at a position deviated toward the fixation section 22.

Figure 4:
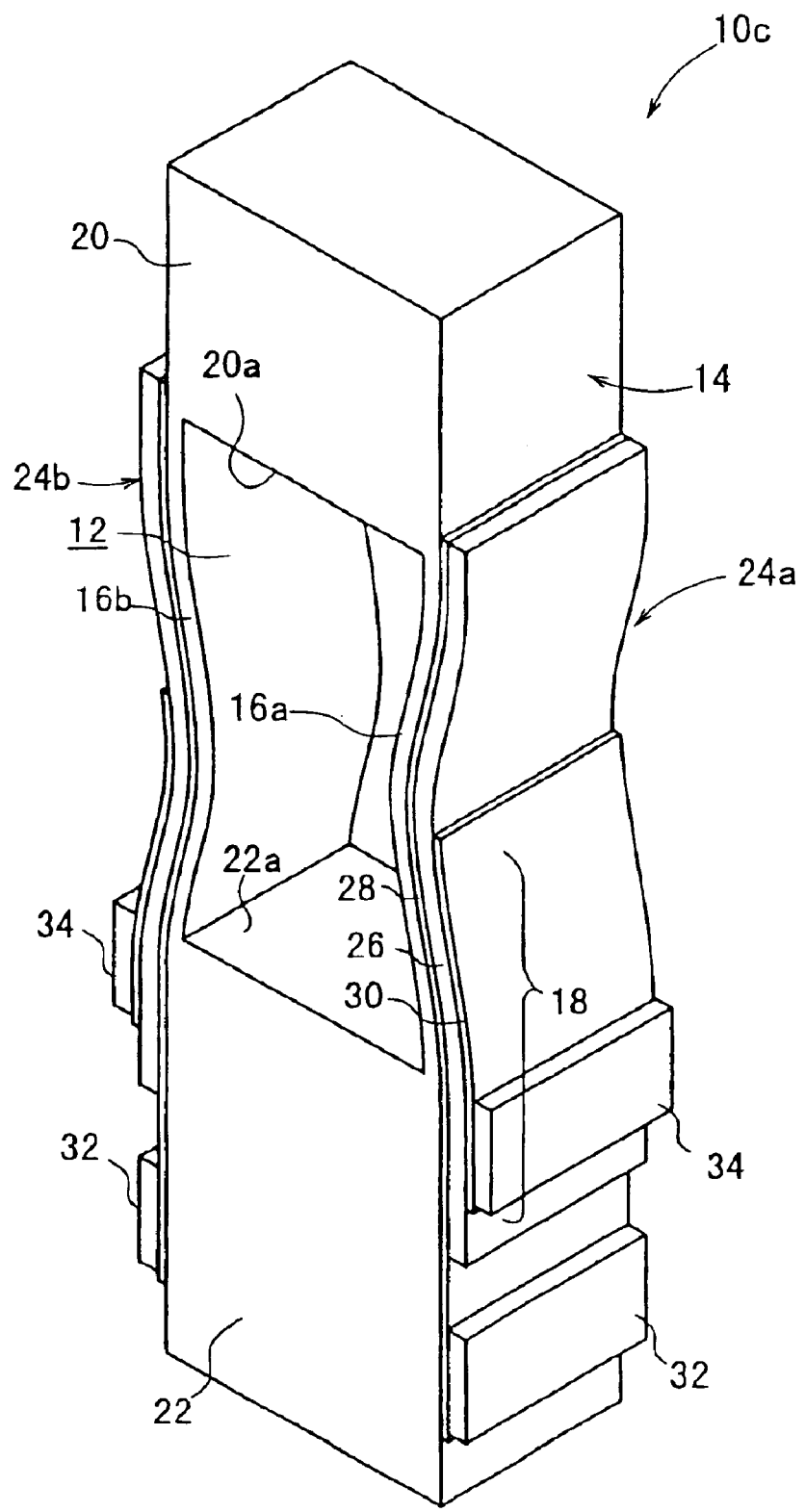
FIG. 4 shows a perspective view illustrating an arrangement of a piezoelectric/electrostrictive device according to a third modified embodiment.

Alternatively, as in a piezoelectric/electrostrictive device 10c according to a third modified embodiment shown in FIG. 4, it is also preferable that the respective forward ends of the first electrode 28 and the piezoelectric/electrostrictive layer 26 are allowed to extend up to the side surface of the movable section 20, and the forward end of the second electrode 30 is located at an approximately central portion in the length direction (Z axis direction) of the thin plate sections 16a, 16b.

In the embodiments described above, the piezoelectric/electrostrictive elements 24a, 24b are constructed by the piezoelectric/electrostrictive layer 26 having the one-layered structure and the pair of electrodes 28, 30. Alternatively, it is also preferable that the piezoelectric/electrostrictive elements 24a, 24b are constructed in a stacked form composed of a plurality of the piezoelectric/electrostrictive layer 26 and the electrodes 28, 30.

Figure 5:
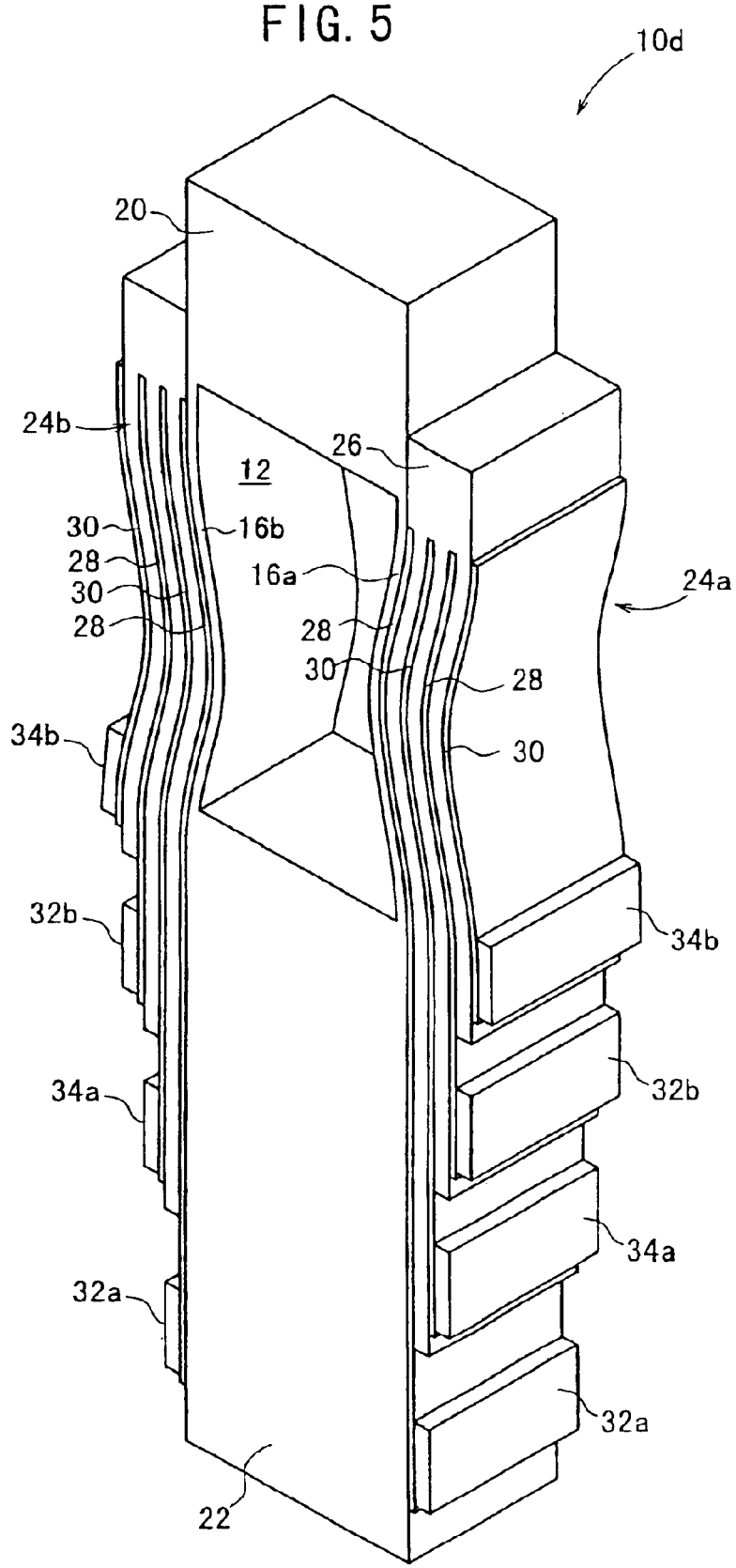
FIG. 5 shows a perspective view illustrating an arrangement of a piezoelectric/electrostrictive device according to a fourth modified embodiment.

For example, as in a piezoelectric/electrostrictive device 10d according to a fourth modified embodiment shown in FIG. 5, each of the piezoelectric/electrostrictive layer 26 and the pair of electrodes 28, 30 resides in a multilayered structure. The first electrodes 28 and the second electrodes 30 are alternately stacked with each other to provide the piezoelectric/electrostrictive elements 24a, 24b which have a multiple stage structure at a portion (substantial driving portion 18) at which the first electrodes 28 and the second electrodes 30 are overlapped with each other with the piezoelectric/electrostrictive layer 26 interposed therebetween. FIG. 5 is illustrative of the following case. That is, the piezoelectric/electrostrictive layer 26 has the three-layered structure. The first electrodes 28 are formed in a separate manner respectively on the lower surface of the first layer (side surface of the thin plate sections 16a, 16b) and on the upper surface of the second layer. The second electrodes 30 are formed in a separate manner respectively on the upper surface of the first layer and on the upper surface of the third layer. Further, terminals 32a, 32b are provided on respective ends of the first electrodes 28 respectively, and terminals 34a, 34b are provided on respective ends of the second electrodes 30 respectively.

Figure 6:
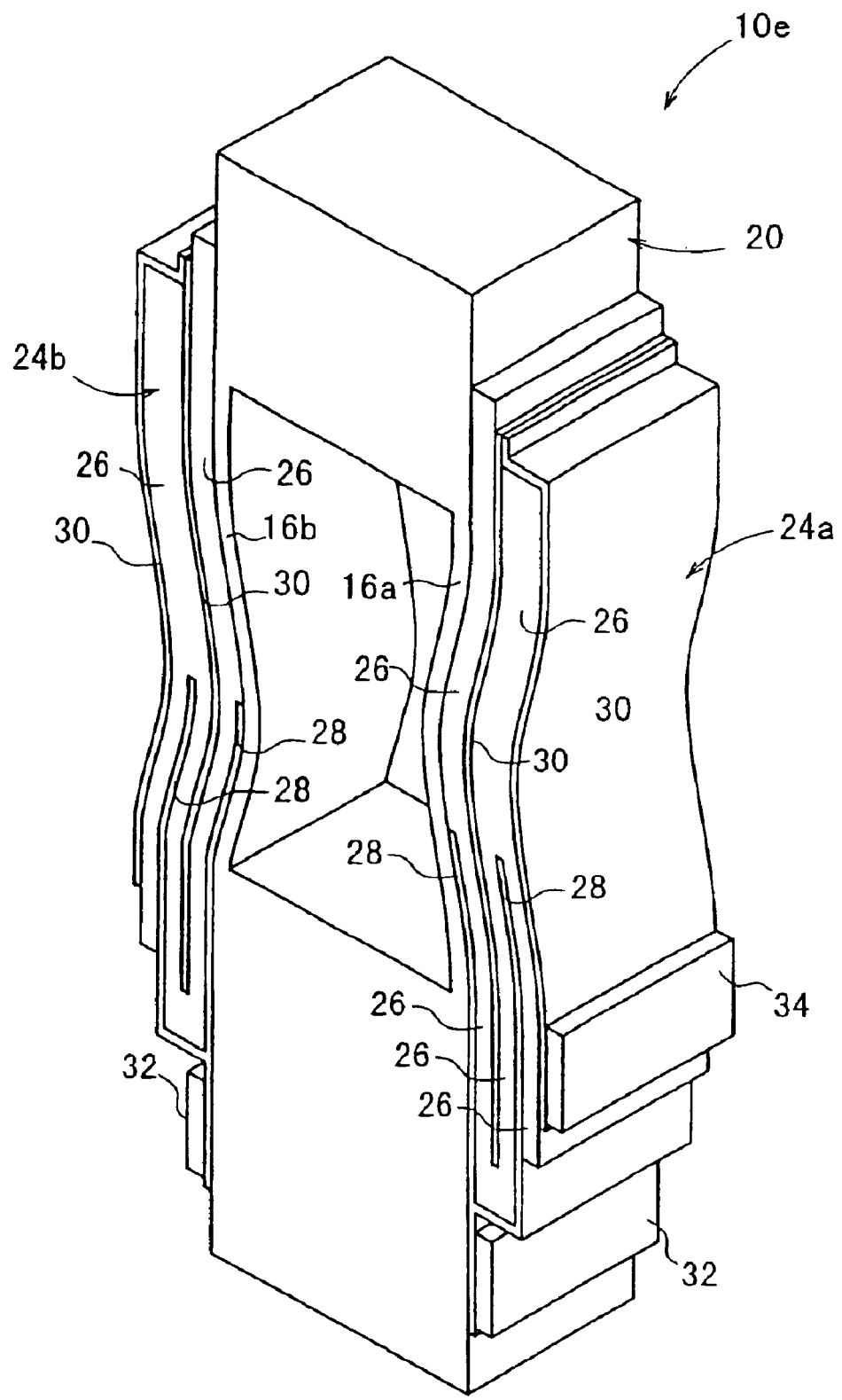
FIG. 6 shows a perspective view illustrating an arrangement of a piezoelectric/electrostrictive device according to a fifth modified embodiment.

As in a piezoelectric/electrostrictive device 10e according to a fifth modified embodiment shown in FIG. 6, each of the piezoelectric/electrostrictive layer 26 and the pair of electrodes 28, 30 resides in a multilayered structure. The first electrode 28 and the second electrode 30 are alternately stacked with each other so that a substantially comb-shaped configuration is obtained in cross section to provide the piezoelectric/electrostrictive elements 24a, 24b which have a multiple stage structure at a portion (substantial driving portion 18) at which the pair of electrode 28 and the second electrode 30 are overlapped with each other with the piezoelectric/electrostrictive layer 26 interposed therebetween. The embodiment shown in FIG. 6 is illustrative of the following case. That is, the piezoelectric/electrostrictive layer 26 has the three-layered structure. The first electrode 28 is formed in a comb-shaped configuration to be located on the lower surface of the first layer (side surface of the thin plate sections 16a, 16b) and on the upper surface of the second layer. The second electrode 30 is formed in a comb-shaped configuration to be located on the upper surface of the first layer and on the upper surface of the third layer. In the case of this structure, each of the first electrode 28 and the second electrode 30 is continuous and common. Accordingly, it is possible to decrease the number of terminals 32, 34 as compared with the structure shown in FIG. 5. Therefore, it is possible to suppress the increase in size which would be otherwise involved in the multilayered structure of the piezoelectric/electrostrictive elements 24a, 24b.

Figure 7:
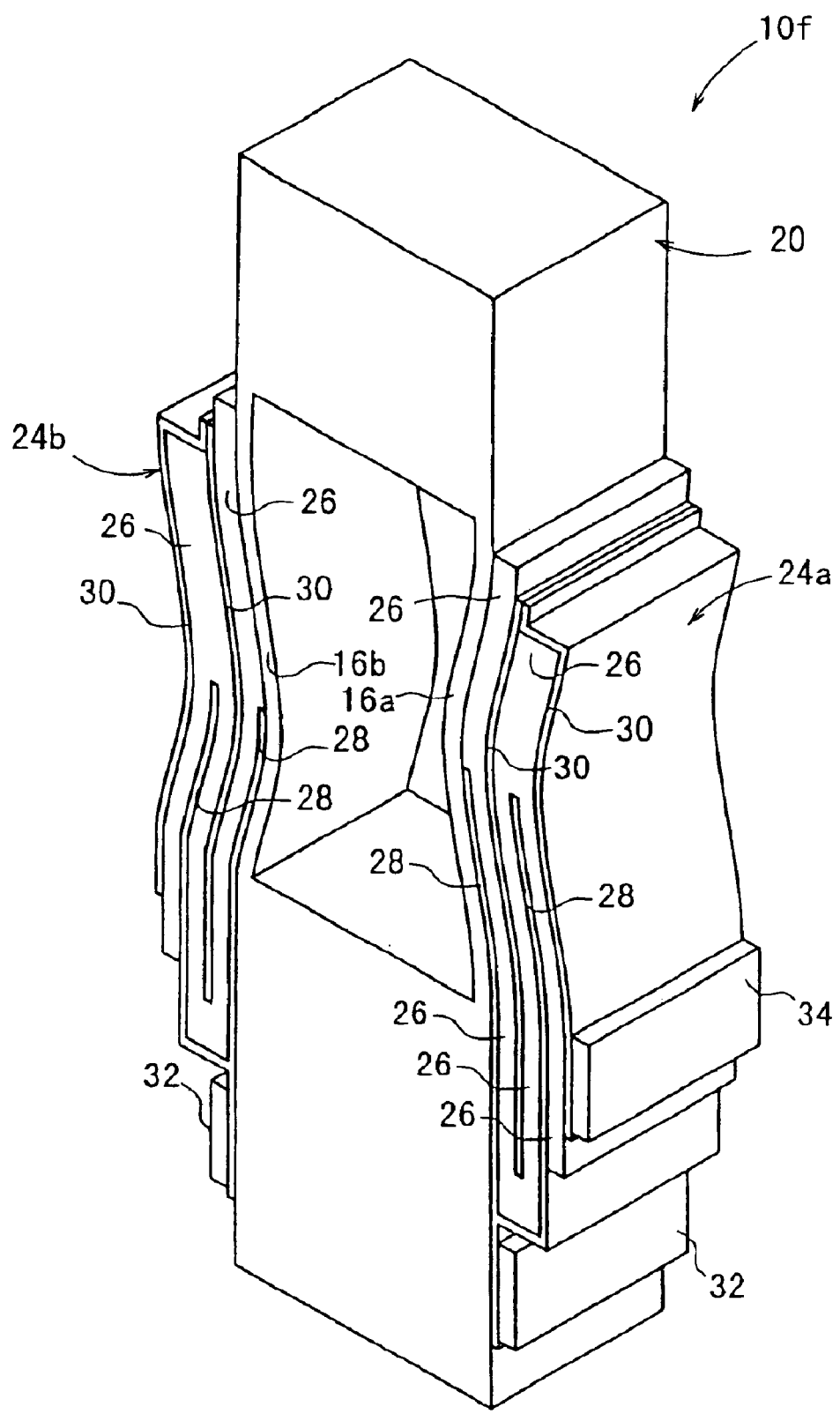
FIG. 7 shows a perspective view illustrating an arrangement of a piezoelectric/electrostrictive device according to a sixth modified embodiment.

As in a piezoelectric/electrostrictive device 10f according to a sixth modified embodiment is shown in FIG. 7, it is also preferable to form the piezoelectric/electrostrictive elements 24a, 24b so that the forward end thereof stays on the thin plate sections 16a, 16b. FIG. 7 is illustrative of a case in which the forward end of the first electrode 28 is located at a substantially central portion in the length direction of the thin plate sections 16a, 16b. This arrangement is advantageous in that the movable section 20 can be displaced to a great extent.

Figure 8:
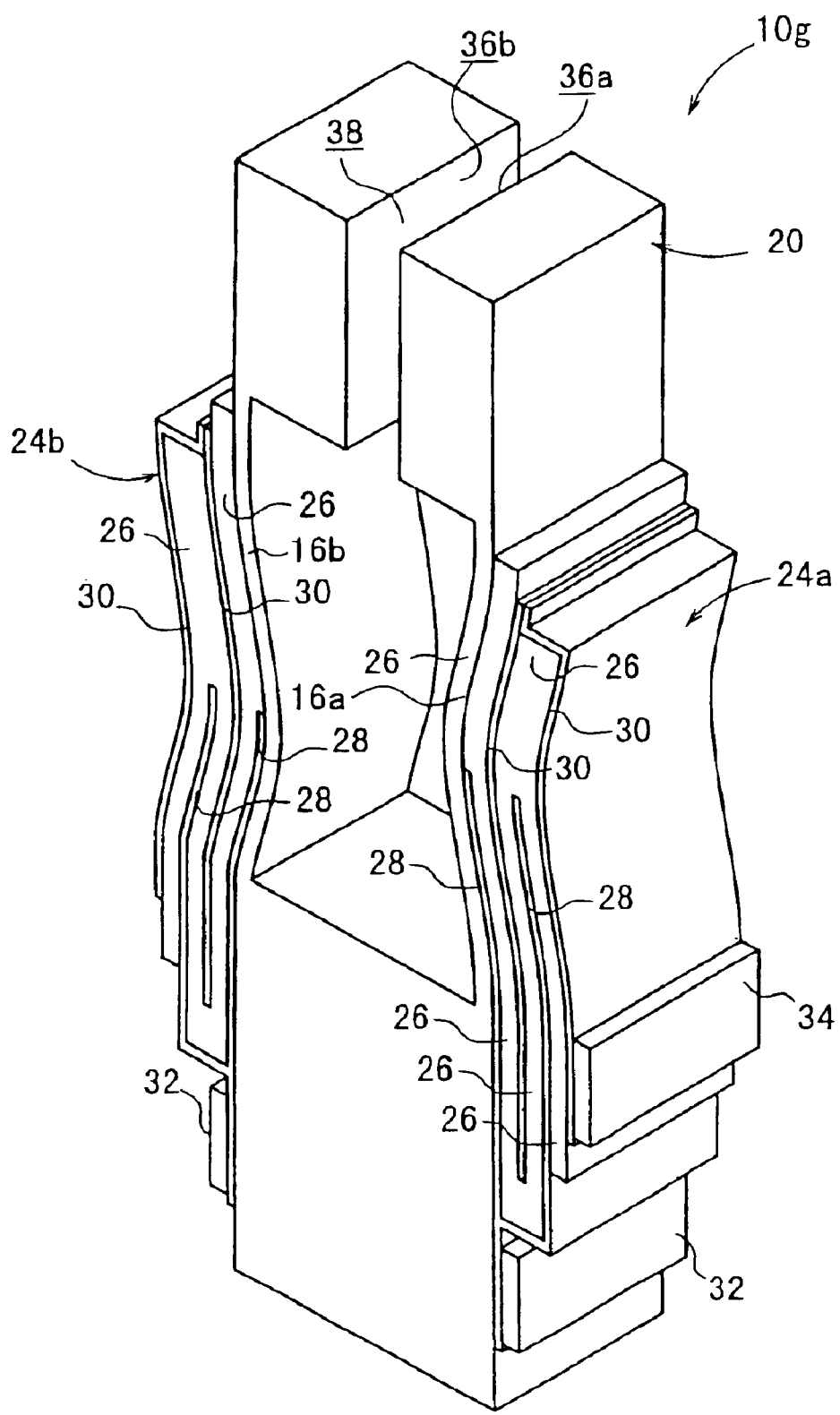
FIG. 8 shows a perspective view illustrating an arrangement of a piezoelectric/electrostrictive device according to a seventh modified embodiment.

As in a piezoelectric/electrostrictive device 10g according to a seventh modified embodiment shown in FIG. 8, it is also preferable that the movable section 20 is provided with mutually opposing end surfaces 36a, 36b. In this arrangement, the internal residual stress, which has been generated in the piezoelectric/electrostrictive elements 24a, 24b and/or the thin plate sections 16a, 16b during the production, can be released by the movement of the end surfaces 36a, 36b. Therefore, the displacement action of the movable section 20 is not inhibited by the internal residual stress. Thus, it is possible to obtain the displacement action of the movable section 20 as designed substantially exactly. Additionally, owing to the release of the stress, it is also possible to improve the mechanical strength of the piezoelectric/electrostrictive device 10g.

As shown in FIG. 8, a gap (air) 38 may be allowed to intervene between the end surfaces 36a, 36b. Alternatively, a member different from the constitutive member of the movable section 20, for example, a member 40 composed of, for example, resin or the like may be allowed to intervene between the end surfaces 36a, 36b. The embodiment described above is illustrative of the case in which the mutually opposing end surfaces 36a, 36b are provided on the movable section 20. Alternatively, the mutually opposing end surfaces 36a, 36b may be provided on the fixation section 22.

Figure 9:
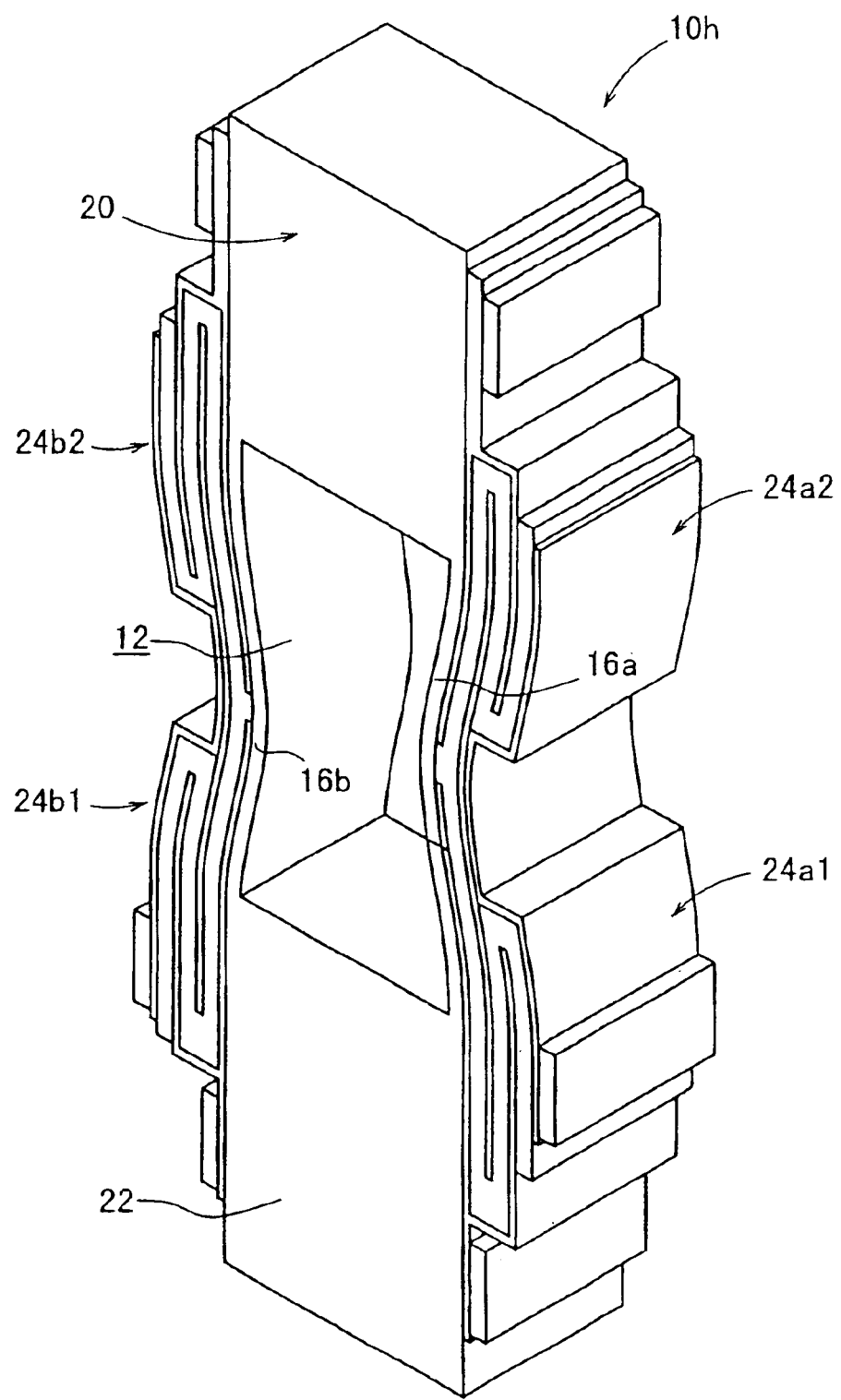
FIG. 9 shows a perspective view illustrating an arrangement of a piezoelectric/electrostrictive device according to an eighth modified embodiment.

Alternatively, as in a piezoelectric/electrostrictive device 10h according to an eighth modified embodiment shown in FIG. 9, it is also preferable that two piezoelectric/electrostrictive elements 24a1, 24b1 having the multiple stage structure are formed to extend over the fixation section 22 and the thin plate sections 16a, 16b, respectively, and another two piezoelectric/electrostrictive elements 24a2, 24b2 having the multiple stage structure are formed to extend over the movable section 20 and the thin plate sections 16a, 16b, respectively. In this arrangement, the movable section 20 can be displaced extremely greatly owing to the effect that the piezoelectric/electrostrictive elements 24a, 24b have the multiple stage structure and the effect that the number of points of action to displace the movable section 20 is increased. Additionally, the piezoelectric/electrostrictive device 10h is excellent in high speed response performance, which is preferred.

Figure 10:
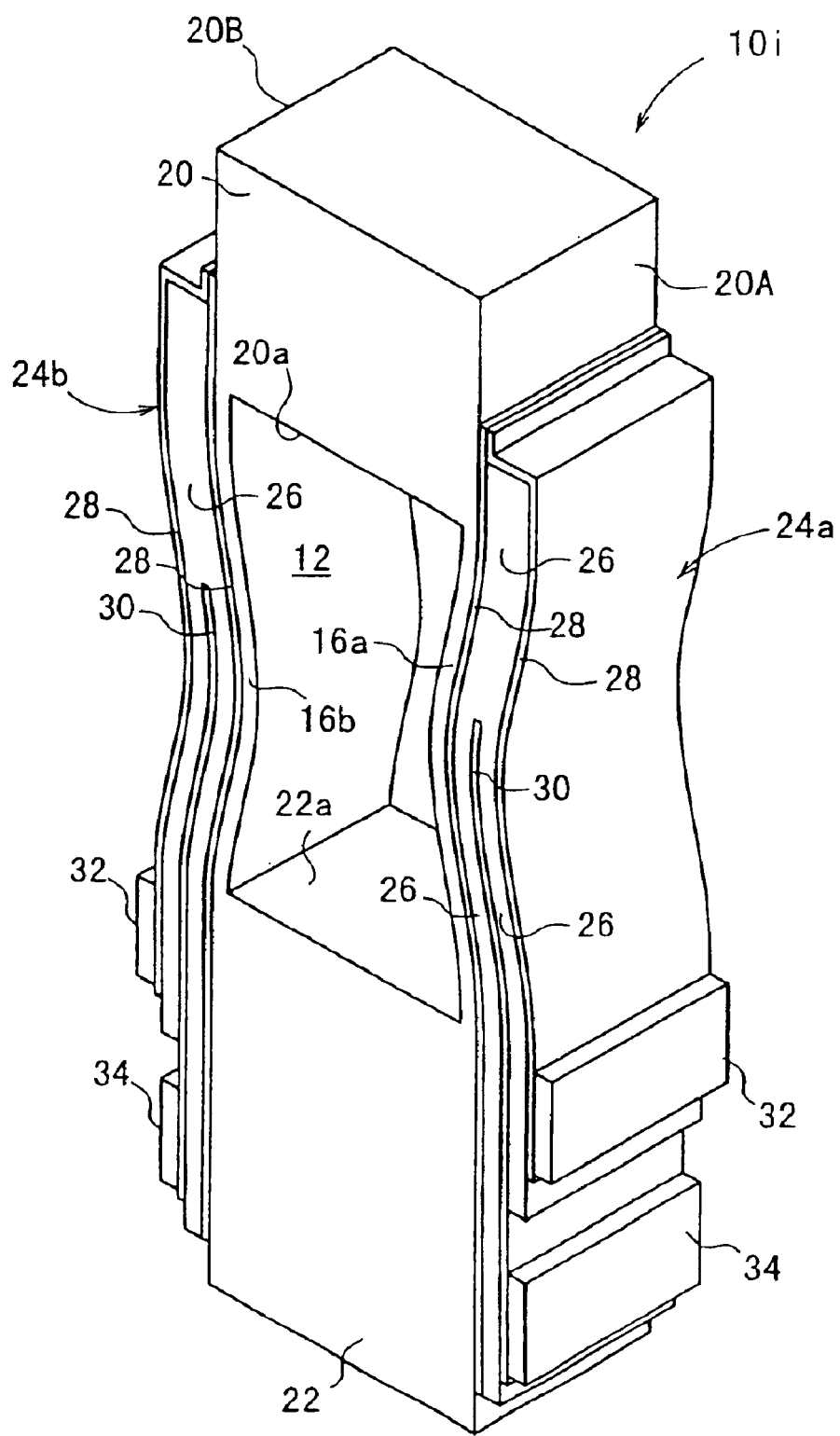
FIG. 10 shows a perspective view illustrating an arrangement of a piezoelectric/electrostrictive device according to a ninth modified embodiment.

Alternatively, as in a piezoelectric/electrostrictive device 10i according to a ninth modified embodiment shown in FIG. 10, it is also preferable that the piezoelectric/electrostrictive layer 26 has the two-layered structure to provide the piezoelectric/electrostrictive elements having the multiple stage structure which are formed in a comb-shaped configuration such that the first electrode 28 is located on the lower surface of the first layer (side surface of the thin plate sections 16a, 16b) and on the upper surface of the second layer, and the second electrode 30 is located on the upper surface of the first layer.

The multiple stage structure of the piezoelectric/electrostrictive elements 24a, 24b as described above increases the force generated by the piezoelectric/electrostrictive elements 24a, 24b, and thus it is possible to obtain the large displacement. Further, the rigidity of the piezoelectric/electrostrictive device 10 itself is increased, and thus it is possible to realize the high resonance frequency. It is possible to achieve the high speed displacement action with ease.

The frequency as referred to herein means a frequency of voltage waveform when the voltage applied to a pair of electrodes 28, 30 is alternately switched to displace the movable section 20 right and left; and the resonance frequency as referred to herein means a maximum frequency at which the displacement action of the movable section 20 can follow in a predetermined vibration mode.

When the number of stages of the piezoelectric/electrostrictive elements 24a, 24b is increased, it is possible to increase the driving force. However, the electric power consumption is also increased in accordance therewith. Therefore, when the device is practically produced and used, for example, it is preferable that the number of stages is appropriately determined depending on the way of use and the state of use. In the case of the piezoelectric/electrostrictive device 10 according to this embodiment, even when the driving force is increased by providing the multiple stage structure of the piezoelectric/electrostrictive elements 24a, 24b, the width of the thin plate sections 16a, 16b (distance in the Y axis direction) is basically unchanged. Therefore, the device is extremely preferred to make application, for example, to the actuator for the purpose of the ringing control and the positioning of the magnetic head for the hard disk drive to be used in an extremely narrow gap.

Figure 11:
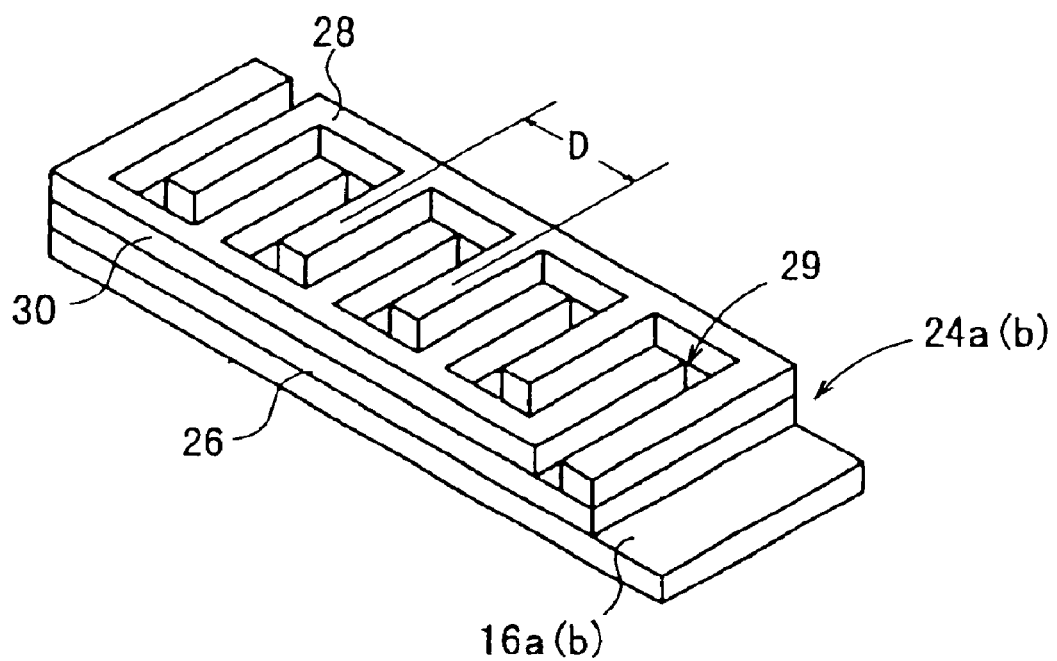
FIG. 11 shows, with partial omission, another embodiment of the piezoelectric/electrostrictive element.

The piezoelectric/electrostrictive elements 24a, 24b are illustrative of the case of the so-called sandwich structure in which the piezoelectric/electrostrictive layer 26 is interposed between the pair of electrodes 28, 30. Alternatively, as shown in FIG. 11, a pair of electrodes 28, 30 having the comb-shaped structure may be formed on the first principal surface of the piezoelectric/electrostrictive layer 26 formed on at least the side surface of the thin plate sections 16a, 16b. Further alternatively, as shown in FIG. 12, a pair of electrodes 28, 30 having the comb-shaped structure may be formed and embedded in the piezoelectric/electrostrictive layer 26 formed on at least the side surface of the thin plate sections 16a, 16b.

The structure shown in FIG. 11 is advantageous in that it is possible to suppress the electric power consumption to be low. The structure shown in FIG. 12 makes it possible to effectively utilize the inverse piezoelectric effect in the direction of the electric field having large generated force and strain, which is advantageous to cause the large displacement.

Specifically, the piezoelectric/electrostrictive elements 24a, 24b shown in FIG. 11 comprise the pair of electrodes 28, 30 having the comb-shaped structure formed on the first principal surface of the piezoelectric/electrostrictive layer 26. In this structure, the first electrode 28 and the second electrode 30 are mutually opposed to one another in an alternate manner with a gap 29 having a constant width interposed therebetween. FIG. 11 is illustrative of the case in which the pair of electrodes 28, 30 are formed on the first principal surface of the piezoelectric/electrostrictive layer 26. Alternatively, the pair of electrodes 28, 30 may be formed between the thin plate sections 16a, 16b and the piezoelectric/electrostrictive layer 26. Further alternatively, the pair of electrodes 28, 30 having the comb-shaped structure may be formed on the first principal surface of the piezoelectric/electrostrictive layer 26 and between the thin plate sections 16a, 16b and the piezoelectric/electrostrictive layer 26 respectively.

Figure 12:
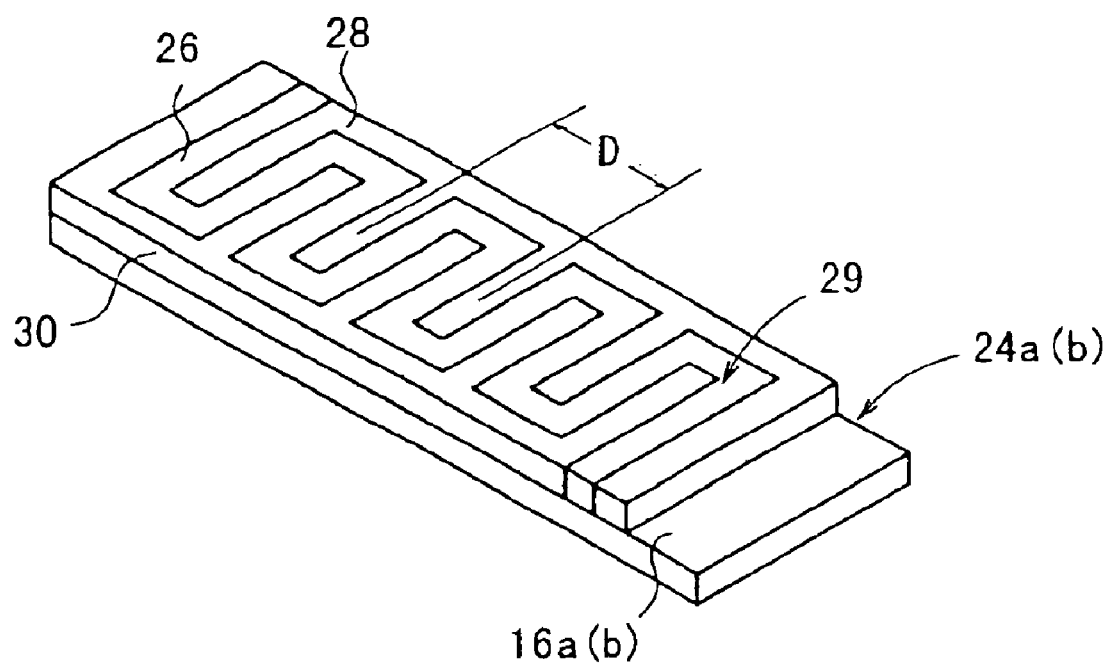
FIG. 12 shows, with partial omission, still another embodiment of the piezoelectric/electrostrictive element.

On the other hand, in the piezoelectric/electrostrictive elements 24a, 24b shown in FIG. 12, the pair of electrodes 28, 30 having the comb-shaped structure are formed so that they are embedded in the piezoelectric/electrostrictive layer 26. In this structure, the first electrode 28 and the second electrode 30 are mutually opposed to one another in an alternate manner with a gap 29 having a constant width interposed therebetween.

The piezoelectric/electrostrictive elements 24a, 24b as shown in FIGS. 11 and 12 can be preferably used for the piezoelectric/electrostrictive device 10 according to the embodiment of the present invention as well. When the pair of electrodes 28, 30 having the comb-shaped structure are used as in the piezoelectric/electrostrictive elements 24a, 24b shown in FIGS. 11 and 12, the displacement of the piezoelectric/electrostrictive elements 24a, 24b can be increased by decreasing the pitch D of the comb teeth of the respective electrodes 28, 30.

Figure 13:
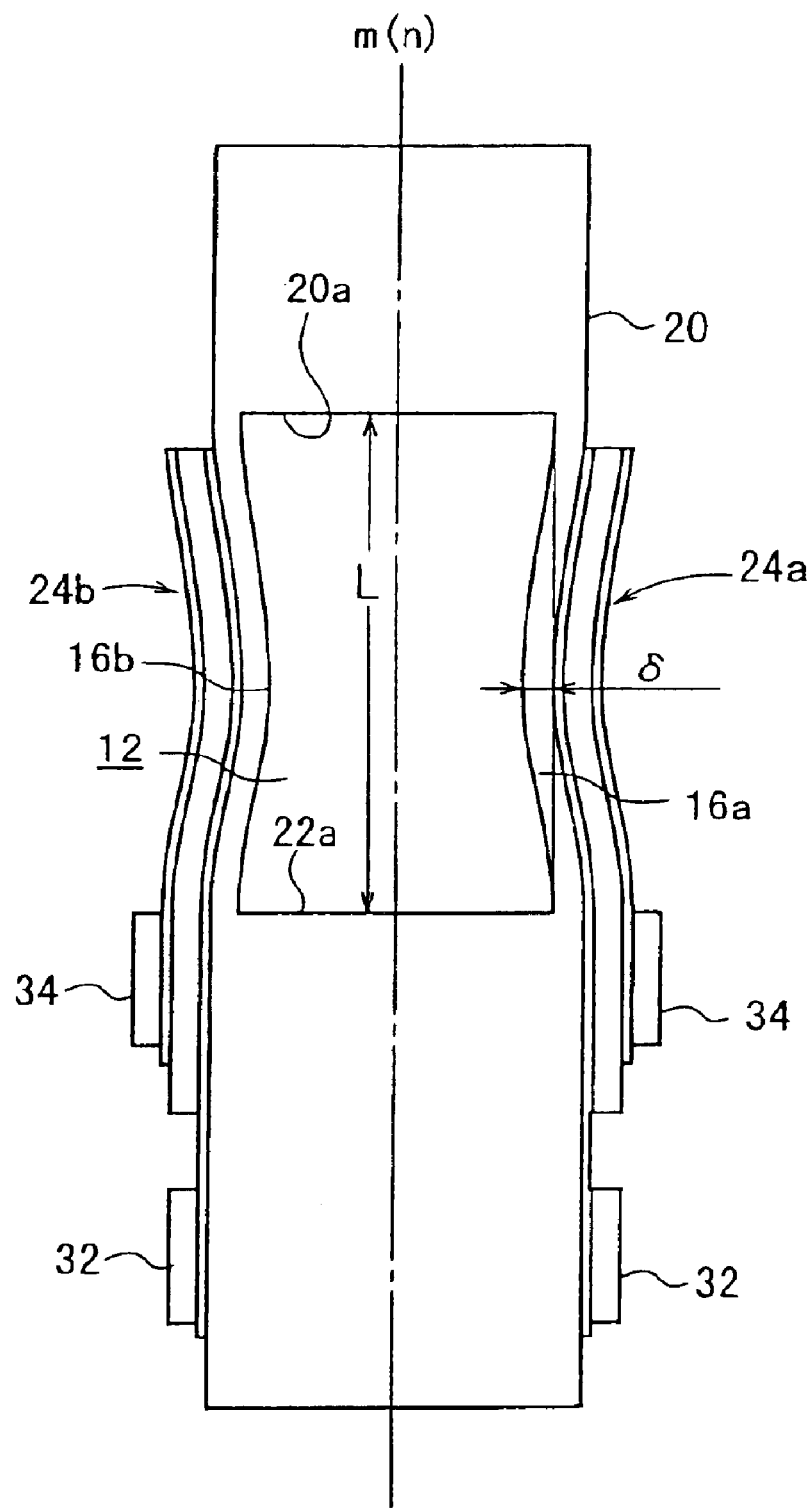
FIG. 13 illustrates a situation in which both of the piezoelectric/electrostrictive elements do not make the displacement action in the piezoelectric/electrostrictive device according to the embodiment of the present invention.

As shown in FIG. 1, the piezoelectric/electrostrictive device 10 according to this embodiment has such a structure that the pair of thin plate sections 16a, 16b are previously bent in directions to make approach from each other, and they are bent inwardly to the hole 12 in a convex configuration. In this arrangement, as shown in FIG. 13, it is set that $0<\delta\leq0.13\,L$ is satisfied provided that the bent amount (previously bent amount) of each of the thin plate sections 16a, 16b is $\delta$, and the length of the thin plate sections 16a, 16b (distance between the inner walls 20a, 22a of the movable section 20 and the fixation section 22) is L. If the bent amount $\delta$ exceeds 0.13 L, the rigidity of the thin plate sections 16a, 16b is extremely reduced, which is disadvantageous. Further, if the bent amount $\delta$ exceeds 0.13 L, the displacement of the movable section 20 is liable to draw an arc-like trace, whereby the displacement to a specific axis as described below is hardly obtained. The term "previously" referred to herein indicates a state in which no voltage is applied to the piezoelectric/electrostrictive elements 24a, 24b, or a state in which no external force is applied to the piezoelectric/electrostrictive device 10, i.e., a non-operating state.

The operation of the piezoelectric/electrostrictive device 10 according to the embodiment of the present invention will now be explained. At first, for example, when the two piezoelectric/electrostrictive elements 24a, 24b are in the natural state, namely when both of the piezoelectric/electrostrictive elements 24a, 24b do not make the displacement action, then the major axis m of the piezoelectric/electrostrictive device 10 (major axis of the fixation section) is substantially coincident with the central axis n of the movable section 20 as shown in FIG. 13.

Figure 14A:
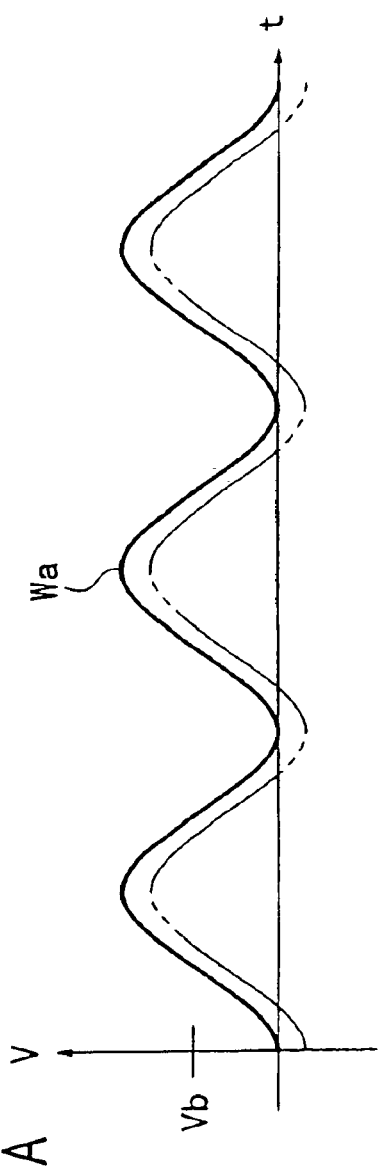
FIG. 14A shows a waveform illustrating a voltage waveform to be applied to the first piezoelectric/electrostrictive element.
Figure 14B:
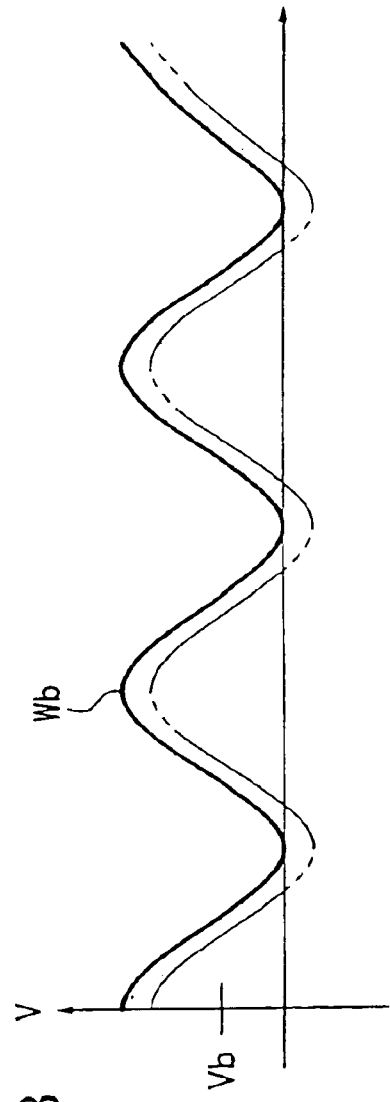
FIG. 14B shows a waveform illustrating a voltage waveform to be applied to the second piezoelectric/electrostrictive element.

Starting from this state, for example, a sine wave Wa, which has a predetermined bias electric potential Vb, is applied to the pair of electrodes 28, 30 of the first piezoelectric/electrostrictive element 24a as shown in a waveform figure shown in FIG. 14A, while a sine wave Wb, which has a phase different from that of the sine wave Wa by about 180°, is applied to the pair of electrodes 28, 30 of the second piezoelectric/electrostrictive element 24b as shown in FIG. 14B.

The piezoelectric/electrostrictive layer 26 of the first piezoelectric/electrostrictive element 24a makes the contraction displacement in the direction of the first principal surface at a stage at which, for example, a voltage having a maximum value is applied to the pair of electrodes 28, 30 of the first piezoelectric/electrostrictive element 24a. Accordingly, as shown in FIG. 15, for example, the stress is generated for the first thin plate section 16a to bend the thin plate section 16a, for example, in the rightward direction as shown by the arrow A. Therefore, the first thin plate section 16a is bent in the rightward direction. At this time, a state is given, in which no voltage is applied to the pair of electrodes 28, 30 of the second piezoelectric/electrostrictive element 24b. Therefore, the second thin plate section 16b follows the bending of the first thin plate section 16a, and it is bent in the rightward direction. As a result, the movable section 20 is displaced, for example, in the rightward direction with respect to the major axis m of the piezoelectric/electrostrictive device 10. The displacement amount is changed depending on the maximum value of the voltage applied to each of the piezoelectric/electrostrictive elements 24a, 24b. For example, the larger the maximum value is, the larger the displacement amount is.

Especially, when a material having coercive electric field is applied as the constitutive material for the piezoelectric/electrostrictive layer 26, it is also preferable that the bias electric potential is adjusted so that the level of the minimum value is a slightly negative level as depicted by waveforms indicated by dashed lines in FIGS. 14A and 14B. In this case, for example, the stress, which is in the same direction as the bending direction of the first thin plate section 16a, is generated in the second thin plate section 16b by driving the piezoelectric/electrostrictive element (for example, the second piezoelectric/electrostrictive element 24b) to which the negative level is applied. Accordingly, it is possible to further increase the displacement amount of the movable section 20. In other words, when the waveforms indicated by the chain double-dashed lines in FIGS. 14A and 14B are used, the device is allowed to have such a function that the piezoelectric/electrostrictive element 24b or 24a, to which the negative level is applied, supports the piezoelectric/electrostrictive element 24a or 24b which principally makes the displacement action.

In the piezoelectric/electrostrictive 10 according to this embodiment, since the thin plate sections 16a, 16b are previously bent in directions to make mutual approach and deformed in a direction substantially same as bending directions of the thin plate sections 16a, 16b due to the action of the piezoelectric/electrostrictive elements 24a, 24b, the thin plate sections 16a, 16b are bent by a relatively small force, whereby the movable section 20 causes displacement. Namely, in this embodiment, as compared with the conventional piezoelectric/electrostrictive devices, equivalent displacement (displacement in the movable section 20) can be obtained with a low voltage, whereby an electric power consumption of electronic instruments installed with the piezoelectric/electrostrictive device 10 can be reduced.

In addition, the structure in which the pair of the thin plate sections 16a, 16b are previously bent in directions to make mutual approach is also a structure in which, from the viewpoint of the bending action of the second thin plate section 16b bending following the bending of the thin plate section 16a due to the action of the first piezoelectric/electrostrictive element 24a, the second thin plate section 16b is previously bent in a direction where the movable section 20 causes displacement due to the action of the first piezoelectric/electrostrictive element 24a.

In other words, the explanation is made with reference to FIG. 15. Since the second thin plate section 16b is previously bent to a direction same as the direction as shown by the arrow A, the second thin plate section 16b is liable to cause displacement in the axis direction where the pair of the thin plate sections 16a, 16b are opposed. Accordingly, the movable section 20 causes the displacement hardly in an arc or rotational state but rather in a uniaxial direction. As a result, it is possible to displace the movable section 20 toward the external space to a great extent.

In the case of the piezoelectric/electrostrictive device 10h according to the eighth embodiment shown in FIG. 9, the voltage (see the sine waveform Wa) shown in FIG. 14A is applied, for example, to the piezoelectric/electrostrictive element 24a1 and the piezoelectric/electrostrictive element 24b2 which are arranged on the diagonal line, and the voltage (see the sine waveform Wb) shown in FIG. 14B is applied to the other piezoelectric/electrostrictive element 24a2 and the other piezoelectric/electrostrictive element 24b1.

As described above, in the piezoelectric/electrostrictive device 10 according to the embodiment of the present invention, the minute displacement of the piezoelectric/electrostrictive elements 24a, 24b is amplified into the large displacement action by utilizing the bending of the thin plate sections 16a, 16b, and it is transmitted to the movable section 20. Accordingly, it is possible to greatly displace the movable section 20 with respect to the major axis m of the piezoelectric/electrostrictive device 10.

In the piezoelectric/electrostrictive device 10 according to this embodiment, the movable section 20, the thin plate sections 16a, 16b, and the fixation section 22 are integrated into one unit. It is unnecessary that all of the parts are formed with the piezoelectric/electrostrictive material which is a fragile material having a relatively heavy weight. Therefore, the device has the following advantages. That is, the device has the high mechanical strength, and it is excellent in handling performance, shock resistance, and moisture resistance. Further, the operation of the device is scarcely affected by harmful vibration (for example, noise vibration and remaining vibration during high speed operation).

In this embodiment, the piezoelectric/electrostrictive elements 24a, 24b are constructed to have the piezoelectric/electrostrictive layer 26 and the pair of electrodes 28, 30 formed on the both sides of the piezoelectric/electrostrictive layer 26. The first electrode 28 of the pair of electrodes 28, 30 is formed on at least the outer surface of the thin plate sections 16a, 16b. Therefore, the vibration caused by the piezoelectric/electrostrictive elements 24a, 24b can be efficiently transmitted to the movable section 20 via the thin plate sections 16a, 16b. Thus it is possible to improve the response performance.

In this embodiment, the portion (substantial driving portion 18), at which the pair of electrodes 28, 30 are overlapped with each other with the piezoelectric/electrostrictive layer 26 interposed therebetween, is continuously formed over the range from the part of the fixation section 22 to the part of the thin plate sections 16a, 16b. If the substantial driving portion 18 is formed to further extend over a part of the movable section 20, then it is feared that the displacement action of the movable section 20 is restricted by the substantial driving portion 18, and it is impossible to obtain the large displacement. However, in this embodiment, the substantial driving portion 18 is formed such that it does not range over both of the movable section 20 and the fixation section 22. Therefore, it is possible to avoid the inconvenience of the restriction of the displacement action of the movable section 20, and it is possible to increase the displacement amount of the movable section 20, owing to the synergistic effect combined with the effect that the thin plate sections 16a, 16b are previously bent in the directions to make separation from each other as described above.

On the other hand, when the piezoelectric/electrostrictive elements 24a, 24b are formed on the part of the movable section 20, it is preferable that the substantial driving portion 18 is located over the range from the part of the movable section 20 to the part of the thin plate sections 16a, 16b, because of the following reason. That is, if the substantial driving portion 18 is formed to extend up to a part of the fixation section 22, the displacement action of the movable section 20 is restricted as described above.

Next, explanation will be made for preferred illustrative constructions of the piezoelectric/electrostrictive device 10 according to the embodiment of the present invention.

At first, as shown in FIG. 1, in order to ensure the displacement action of the movable section 20, it is preferable that the distance g, by which the substantial driving portion 18 of the piezoelectric/electrostrictive elements 24a, 24b is overlapped with the fixation section 22 or the movable section 20, is not less than ½ of the thickness d of the thin plate sections 16a, 16b.

The device is constructed such that the ratio a/b between the distance a selected as a larger distance from the distance in the X axis direction between the joined portions of the inner wall 20a of the movable section 20 and the thin plate sections 16a, 16b and the distance in the X axis direction between the joined portions of the inner wall 22a of the fixation section 22 and the thin plate sections 16a, 16b, and the width (distance in the Y axis direction) b of the thin plate sections 16a, 16b is 0.5 to 20. The ratio a/b is preferably 1 to 10 and more preferably 2 to 8. The prescribed value of the ratio a/b is prescribed on the basis of the discovery that the displacement amount of the movable section 20 can be increased, and the displacement in the X-Z plane can be dominantly obtained.

On the other hand, it is desirable that the ratio L/a between the length (distance in the Z axis direction) L of the thin plate sections 16a, 16b and the distance a described above is preferably 0.5 to 10 and more preferably 0.7 to 5. The prescribed value of the ratio L/a is prescribed on the basis of the discovery that the displacement amount of the movable section 20 can be increased, and the displacement action can be performed at a high resonance frequency (high response speed can be achieved).

Therefore, in order to suppress the flapping displacement in the Y axis direction or the vibration of the piezoelectric/electrostrictive device 10 according to this embodiment and provide the structure in which the high speed response performance is excellent and the large displacement is simultaneously obtained at a relatively low voltage, it is preferable that the ratio a/b is 0.5 to 20 and the ratio L/a is 0.5 to 10, and it is more preferable that the ratio a/b is 1 to 10 and the ratio L/a is 0.7 to 5.

Further, it is preferable that the hole 12 is filled with a gel material, for example, silicone gel. Usually, the displacement action of the movable section 20 is restricted by the presence of such a filler material. However, in this embodiment, it is intended to increase the displacement amount of the movable section 20 by bending the thin plate sections 16a, 16b in directions to make mutual approach. Therefore, the restriction of the displacement action of the movable section 20 due to the filler material is counteracted. Accordingly, it is possible to realize the effect owing to the presence of the filler material, namely the realization of the high resonance frequency and the maintenance of the rigidity.

It is preferable that the length (distance in the Z axis direction) f of the movable section 20 is short, because of the following reason. That is, it is possible to realize the light weight and increase the resonance frequency by shortening the length. However, in order to ensure the rigidity of the movable section 20 in the X axis direction and obtain its reliable displacement, it is desirable that the radio f/d with respect to the thickness d of the thin plate sections 16a, 16b is not less than 3 and preferably not less than 10.

The actual size of each component is determined considering, for example, the joining area for attaching the part to the movable section 20, the joining area for attaching the fixation section 22 to another member, the joining area for attaching the electrode terminal or the like, and the strength, the durability, the necessary displacement amount, the resonance frequency, and the driving voltage of the entire piezoelectric/electrostrictive device 10.

Specifically, for example, the distance a selected as the larger distance from the distance in the X axis direction between the joined portions of the inner wall 20a of the movable section 20 and the thin plate sections 16a, 16b and the distance in the X axis direction between the joined portions of the inner wall 22a of the fixation section 22 and the thin plate sections 16a, 16b is preferably 100 $\mu$m to 2000 $\mu$m and more preferably 200 $\mu$m to 1000 $\mu$m. The width b of the thin plate sections 16a, 16b is preferably 50 $\mu$m to 2000 $\mu$m and more preferably 100 $\mu$m to 500 $\mu$m. The thickness d of the thin plate sections 16a, 16b is preferably 2 $\mu$m to 100 $\mu$m and more preferably 4 $\mu$m to 50 $\mu$m, while it satisfies b>d in relation to the width b of the thin plate sections 16a, 16b, in order to make it possible to effectively suppress the flapping displacement which is the displacement component in the Y axis direction.

The length L of the thin plate sections 16a, 16b is preferably 200 $\mu$m to 3000 $\mu$m and more preferably 300 $\mu$m to 2000 $\mu$m. The length f of the movable section 20 is preferably 50 $\mu$m to 2000 $\mu$m and more preferably 100 $\mu$m to 1000 $\mu$m.

The arrangement as described above exhibits such an extremely excellent effect that the displacement in the Y axis direction does not exceeds 10% with respect to the displacement in the X axis direction, while the device can be driven at a low voltage by appropriately making adjustment within the range of the size ratio and the actual size described above, and it is possible to suppress the displacement component in the Y axis direction to be not more than 5%. In other words, the movable section 20 is displaced in one axis direction, i.e., substantially in the X axis direction. Further, the high speed response is excellent, and it is possible to obtain the large displacement at a relatively low voltage.

In the piezoelectric/electrostrictive device 10, the shape of the piezoelectric/electrostrictive device is not the plate-shaped configuration unlike conventional one. Each of the movable section 20 and the fixation section 22 has the rectangular parallelepiped-shaped configuration. The pair of thin plate sections 16a, 16b are provided so that the side surface of the movable section 20 is continuous to the side surface of the fixation section 22. Additionally, the pair of thin plate sections 16a, 16b are previously bent in the directions to make mutual approach. Therefore, it is possible to selectively increase the rigidity of piezoelectric/electrostrictive device 10 in the Y axis direction.

That is, in the piezoelectric/electrostrictive device 10, it is possible to highly selectively generate only the operation of the movable section 20 in the plane (XZ plane). It is possible to suppress the operation of the movable section 20 in the YZ plane (operation in the so-called flapping direction).

Next, explanation will be made for the respective constitutive components of the piezoelectric/electrostrictive device 10 according to the embodiment of the present invention.

As described above, the movable section 20 is the portion which is operated on the basis of the driving amount of the thin plate sections 16a, 16b, and a variety of members are attached thereto depending on the purpose of use of the piezoelectric/electrostrictive device 10. For example, when the piezoelectric/electrostrictive device 10 is used as a displacement element, a shield plate for an optical shutter or the like is attached thereto. Especially, when the piezoelectric/electrostrictive device 10 is used for the mechanism for positioning a magnetic head of a hard disk drive or for suppressing the ringing, a member required to be positioned is attached thereto, including, for example, the magnetic head, a slider provided with the magnetic head, and a suspension provided with the slider.

As described above, the fixation section 22 is the portion for supporting the thin plate sections 16a, 16b and the movable section 20. For example, when the piezoelectric/ electrostrictive device 10 is utilized to position the magnetic head of the hard disk drive, the entire piezoelectric/ electrostrictive device 10 is fixed by supporting and securing the fixation section 22, for example, to a carriage arm attached to VCM (voice coil motor) or a fixation plate or a suspension attached to the carriage arm. As shown in FIG. 1, the terminals 32, 34 for driving the piezoelectric/ electrostrictive elements 24a, 24b and other members are arranged on the fixation section 22 in some cases.

The material for constructing the movable section 20 and the fixation section 22 is not specifically limited provided that it has rigidity. However, it is possible to preferably use ceramics to which the ceramic green sheet-laminating method is applicable as described later on. Specifically, the material includes, for example, materials containing a major component of zirconia represented by fully stabilized zirconia and partially stabilized zirconia, alumina, magnesia, silicon nitride, aluminum nitride, and titanium oxide, as well as materials containing a major component of a mixture of them. However, in view of the high mechanical strength and the high toughness, it is preferable to use a material containing a major component of zirconia, especially fully stabilized zirconia and a material containing a major component of partially stabilized zirconia. The metal material is not limited provided that it has rigidity. However, the metal material includes, for example, stainless steel and nickel.

As described above, the thin plate sections 16a, 16b are the portions which are driven in accordance with the displacement of the piezoelectric/electrostrictive elements 24a, 24b. The thin plate sections 16a, 16b are the thin plate-shaped member having flexibility, and they function to amplify the expansion and contracting displacement of the piezoelectric/electrostrictive elements 24a, 24b arranged on the surface as the bending displacement and transmit the displacement to the movable section 20. Therefore, it is enough that the shape or the material of the thin plate sections 16a, 16b provides the flexibility with the mechanical strength of such a degree that it is not broken by the bending displacement. It is possible to make appropriate selection considering the response performance and the operability of the movable section 20.

It is preferable that the thickness d of the thin plate sections 16a, 16b is preferably about 2 $\mu$m to 100 $\mu$m. It is preferable that the combined thickness of the thin plate section 16a (or 16b) and the piezoelectric/electrostrictive element 24a (or 24b) is 7 $\mu$m to 500 $\mu$m. It is preferable that the thickness of the electrodes 28, 30 is 0.1 to 50 $\mu$m, and the thickness of the piezoelectric/electrostrictive layer 26 is 3 to 300 $\mu$m. The width b of the thin plate sections 16a, 16b is preferably 50 $\mu$m to 2000 $\mu$m.

Ceramics, which is similarly used for the movable section 20 and the fixation section 22, can be preferably used as the material for constructing the thin plate sections 16a, 16b. A material containing a major component of zirconia, especially fully stabilized zirconia and a material containing a major component of partially stabilized zirconia are most preferably used, because the mechanical strength is large even in the case of a thin wall thickness, the toughness is high, and the reactivity with the piezoelectric/electrostrictive layer and the electrode material is small.

When the thin plate sections 16a, 16b are made of a metal material, it is enough that the metal material has flexibility and the metal material is capable of bending displacement as described above. However, preferably, it is desirable that the thin plate sections 16a, 16b are made of an iron-based material such as various stainless steel materials and various spring steel materials. Alternatively, it is desirable that the thin plate sections 16a, 16b are made of a non-ferrous material such as beryllium copper, phosphor bronze, nickel, and nickel-iron alloy.

Those which are fully stabilized or partially stabilized as follows are preferably used as fully stabilized zirconia or partially stabilized zirconia as described above. That is, the compound to be used for fully stabilizing or partially stabilizing zirconia includes yttrium oxide, ytterbium oxide, cerium oxide, calcium oxide, and magnesium oxide. When at least one compound of them is added and contained, zirconia is partially or fully stabilized. However, as for the stabilization, the objective zirconia can be stabilized not only by adding one type of the compound but also by adding a combination of the compounds.

The amount of addition of each of the compounds is desirably as follows. That is, yttrium oxide or ytterbium oxide is added by 1 to 30 mole %, preferably 1.5 to 10 mole %. Cerium oxide is added by 6 to 50 mole %, preferably 8 to 20 mole %. Calcium oxide or magnesium oxide is added by 5 to 40 mole %, preferably 5 to 20 mole %. Especially, it is preferable to use yttrium oxide as a stabilizer. In this case, yttrium oxide is desirably added by 1.5 to 10 mole %, more preferably 2 to 4 mole %. For example, alumina, silica, or transition metal oxide may be added as an additive of sintering aid or the like in a range of 0.05 to 20% by weight. However, when the sintering integration based on the film formation method is adopted as a technique for forming the piezoelectric/electrostrictive elements 24a, 24b, it is also preferable to add, for example, alumina, magnesia, and transition metal oxide as an additive.

In order to obtain the mechanical strength and the stable crystal phase, it is desirable that the average crystal grain size of zirconia is 0.05 to 3 $\mu$m, preferably 0.05 to 1 $\mu$m. As described above, ceramics can be used for the thin plate sections 16a, 16b in the same manner as in the movable section 20 and the fixation section 22. Preferably, it is advantageous to construct the thin plate sections 16a, 16b with a substantially identical material in view of the reliability of the joined portion and the strength of the piezoelectric/electrostrictive device 10, in order to reduce any complicated procedure of the production.

The piezoelectric/electrostrictive elements 24a, 24b have at least the piezoelectric/electrostrictive layer 26 and the pair of electrodes 28, 30 for applying the electric field to the piezoelectric/electrostrictive layer 26. It is possible to use, for example, piezoelectric/electrostrictive elements of the unimorph type and the bimorph type. However, those of the unimorph type are suitable for the piezoelectric/electrostrictive device 10 as described above, because they are excellent in stability of the generated displacement amount and they are advantageous to realize the light weight.

For example, as shown in FIG. 1, it is possible to preferably use, for example, the piezoelectric/electrostrictive elements 24a, 24b comprising the first electrode 28, the piezoelectric/electrostrictive layer 26, and the second electrode 30 which are stacked in the layered configuration. Additionally, it is also preferable to provide the multiple stage structure as shown in FIGS. 5 to 10.

As shown in FIG. 1, the piezoelectric/electrostrictive elements 24a, 24b are preferably formed on the outer surface side of the piezoelectric/electrostrictive device 10 in view of the fact that the thin plate sections 16a, 16b can be driven to a greater extent. However, the piezoelectric/electrostrictive elements 24a, 24b may be formed on the inner surface side of the piezoelectric/electrostrictive device 10, i.e., on the inner wall surface of the hole 12 depending on, for example, the form of use. Alternatively, the piezoelectric/electrostrictive elements 24a, 24b may be formed both on the outer surface side and on the inner surface side.

Piezoelectric ceramics is preferably used for the piezoelectric/electrostrictive layer 26. However, it is also possible to use electrostrictive ceramics, ferroelectric ceramics, or anti-ferroelectric ceramics. However, when the piezoelectric/electrostrictive device 10 is used, for example, to position the magnetic head of the hard disk drive, it is important to provide the linearity concerning the displacement amount of the movable section 20 and the driving voltage or the output voltage. Therefore, it is preferable to use a material having small strain hysteresis. It is preferable to use a material having a coercive electric field of not more than 10 kV/mm.

Specified materials include ceramics containing, for example, lead zirconate, lead titanate, lead magnesium niobate, lead nickel niobate, lead zinc niobate, lead manganese niobate, lead antimony stannate, lead manganese tungstate, lead cobalt niobate, barium titanate, sodium bismuth titanate, potassium sodium niobate, and strontium bismuth tantalate singly or in mixture, or in the form of a compound.

Especially, a material containing a major component of lead zirconate, lead titanate, and lead magnesium niobate, or a material containing a major component of sodium bismuth titanate is preferably used, in order to obtain the product having a stable composition with a high electromechanical coupling factor and a piezoelectric constant and with small reactivity with the thin plate sections 16a, 16b (ceramics) during the sintering of the piezoelectric/electrostrictive layer 26.

It is also preferable to use ceramics obtained by adding, to the material described above, for example, oxides of lanthanum, calcium, strontium, molybdenum, tungsten, barium, niobium, zinc, nickel, manganese, cerium, cadmium, chromium, cobalt, antimony, iron, yttrium, tantalum, lithium, bismuth, and stannum singly or in mixture or in compound.

For example, when lanthanum and/or strontium is contained in the major components of lead zirconate, lead titanate, and lead magnesium niobate, an advantage is obtained in some cases, for example, in such a way that the coercive electric field and the piezoelectric characteristic can be adjusted.

It is desirable to avoid the addition of a material such as silica which tends to form glass, because of the following reason. That is, the material such as silica tends to react with the piezoelectric/electrostrictive material during the heat treatment for the piezoelectric/electrostrictive layer. As a result, the composition is varied, and the piezoelectric characteristic is deteriorated.

On the other hand, it is preferable that the pair of electrodes 28, 30 of the piezoelectric/electrostrictive elements 24a, 24b are made of metal which is solid at room temperature and which is excellent in conductivity. For example, it is possible to use metal simple substance or alloy of, for example, aluminum, titanium, chromium, iron, cobalt, nickel, copper, zinc, niobium, molybdenum, ruthenium, palladium, rhodium, silver, stannum, tantalum, tungsten, iridium, platinum, gold, and lead. It is also preferable to use a cermet material obtained by dispersing, in the metal described above, the same material as that of the piezoelectric/electrostrictive layer 26 and/or the thin plate sections 16a, 16b.

The material for the electrodes 28, 30 of the piezoelectric/electrostrictive elements 24a, 24b is selected and determined depending on the method for forming the piezoelectric/electrostrictive layer 26. For example, when the piezoelectric/electrostrictive layer 26 is formed by sintering on the first electrode 28 after the first electrode 28 is formed on the thin plate sections 16a, 16b, it is necessary for the first electrode 28 to use high melting point metal such as platinum, palladium, platinum-palladium alloy, and silver-palladium alloy which does not change at the sintering temperature for the piezoelectric/electrostrictive layer 26. However, the electrode formation can be performed at a low temperature for the second electrode 30 which is formed on the piezoelectric/electrostrictive layer 26 after forming the piezoelectric/electrostrictive layer 26. Therefore, it is possible for the second electrode 30 to use low melting point metal such as aluminum, gold, and silver.

The thickness of the electrodes 28, 30 also serves as a factor to considerably decrease the displacement of the piezoelectric/electrostrictive elements 24a, 24b. Therefore, it is preferable, especially for the electrode formed after the sintering of the piezoelectric/electrostrictive layer 26, to use organic metal paste capable of obtaining a dense and thinner film after the sintering, for example, a material such as gold resinate paste, platinum resinate paste, and silver resinate paste.

Next, explanation will be made with reference to FIGS. 16A to 26 for the method for producing the piezoelectric/electrostrictive device 10 according to the embodiment of the present invention.

Ceramics is preferably used for the constitutive material for each of the members of the piezoelectric/electrostrictive device 10 according to the embodiment of the present invention. It is preferable that the constitutive elements of the piezoelectric/electrostrictive device 10 concerning the substrate 14 except for the piezoelectric/electrostrictive elements 24a, 24b, i.e., the thin plate sections 16a, 16b, the fixation section 22, and the movable section 20 are produced by using the ceramic green sheet-laminating method. On the other hand, it is preferable that the piezoelectric/electrostrictive elements 24a, 24b as well as the respective terminals 32, 34 are produced by using the film formation method, for example, for the thin film and the thick film.

According to the ceramic green sheet-laminating method in which the respective members of the substrate 14 of the piezoelectric/electrostrictive device 10 can be formed in an integrated manner, the time-dependent change of state scarcely occurs at the joined portions of the respective members. Therefore, this method provides the high reliability of the joined portion, and it is advantageous to ensure the rigidity.

In the piezoelectric/electrostrictive device 10 according to this embodiment, the boundary portion (joined portion) between the thin plate sections 16a, 16b and the fixation section 22 and the boundary portion (joined portion) between the thin plate sections 16a, 16b and the movable section 20 function as supporting points for expressing the displacement. Therefore, the reliability of the joined portion is an important point which dominates the characteristic of the piezoelectric/electrostrictive device 10.

The production methods described below are excellent in reproducibility and formability. Therefore, it is possible to obtain the piezoelectric/electrostrictive device 10 having a predetermined shape within a short period of time with good reproducibility.

A first production method for the piezoelectric/electrostrictive device 10 according to the embodiment of the present invention will be specifically explained below. The laminate, which is obtained by laminating the ceramic green sheets, is defined to be the ceramic green laminate 58 (see, for example, FIG. 16B). The integrated matter, which is obtained by sintering the ceramic green laminate 58, is defined to be the ceramic laminate 60 (see, for example, FIG. 17). The integrated matter comprising the movable section 20, the thin plate sections 16a, 16b, and the fixation section 22, which is obtained by cutting off unnecessary portions from the ceramic laminate 60, is defined to be the ceramic substrate 14C (see FIG. 18).

In the first production method, the ceramic laminate 60 is finally cut into chip units to produce a large number of piezoelectric/electrostrictive devices 10. However, in order to simplify the explanation, description will be made principally for the case in which one individual of piezoelectric/electrostrictive device 10 is produced.

At first, for example, a binder, a solvent, a dispersing agent, and a plasticizer are added and mixed with a ceramic powder such as zirconia to prepare a slurry. The slurry is subjected to a degassing treatment, and then a ceramic green sheet having a predetermined thickness is prepared in accordance with, for example, the reverse roll coater method and the doctor blade method.

Figure 16B:
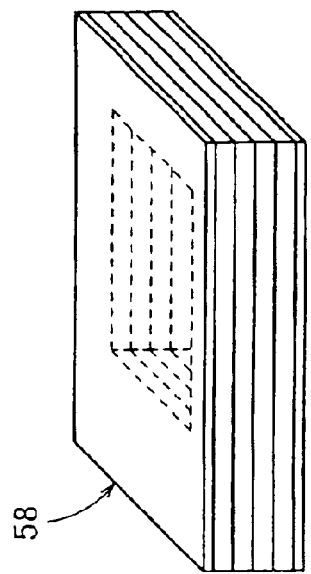
FIG. 16B illustrates a state in which a ceramic green laminate is formed.
Figure 16C:
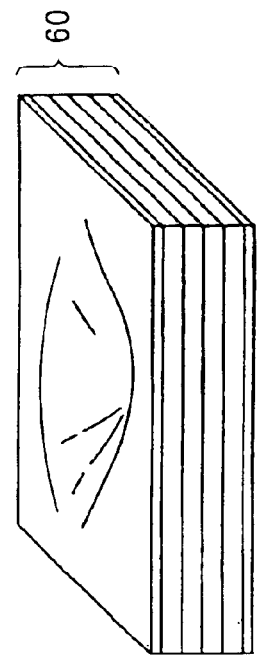
FIG. 16C illustrates a state in which the ceramic green laminate is sintered to produce a ceramic laminate.
Figure 16A:
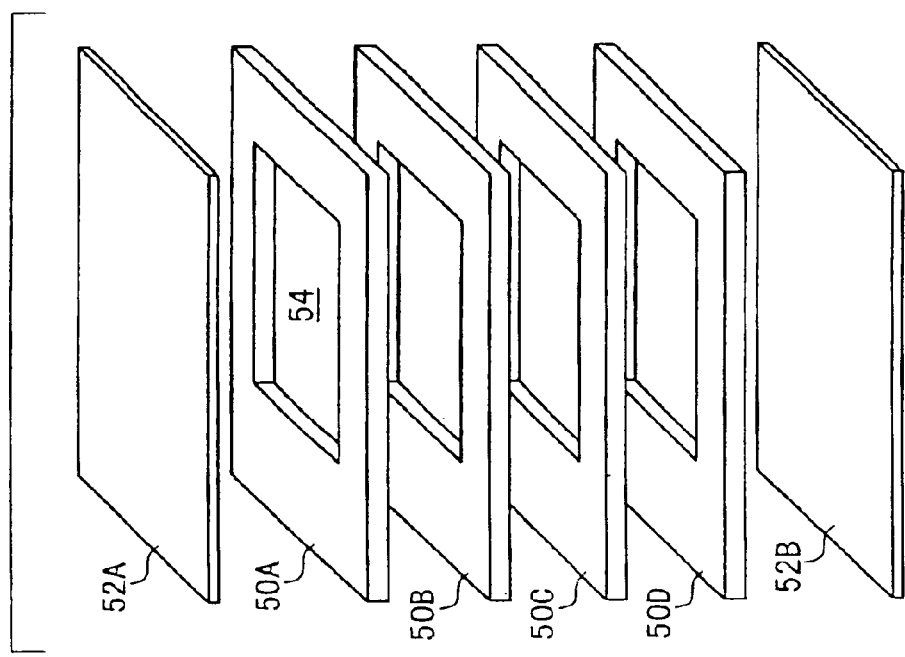
FIG. 16A illustrates a process for laminating necessary ceramic green sheets when the piezoelectric/electrostrictive device according to the embodiment of the present invention is produced in accordance with a first production method.

Subsequently, the ceramic green sheet is processed into those having various shapes as shown in FIG. 16A in accordance with, for example, the punching out based on the mold and the laser machining to obtain a plurality of ceramic green sheets 50A to 50D, 52A, 52B for forming the substrate.

The ceramic green sheets 50A to 50D, 52A, 52B include the plurality (for example, four) of ceramic green sheets 50A to 50D each of which is formed with a window 54 for forming at least the hole 12 thereafter, and the plurality (for example, two) of ceramic green sheets 52A, 52B to be formed into the thin plate sections 16a, 16b thereafter. In this case, those having the difference in sintering shrinkage speed and/or sintering shrinkage amount are used for the ceramic green sheets 50A to 50D and the ceramic green sheets 52A, 52B respectively. Specifically, those used are exemplified such that the ceramic green sheets 50A to 50D are sintered at fast timing as compared with the ceramic green sheets 52A, 52B during the sintering of the ceramic green sheets, or the sintering shrinkage amount of the ceramic green sheets 50A to 50D is smaller than that of the ceramic green sheets 52A, 52B. The numbers of ceramic green sheets referred to above are not limited thereto but by way of example.

In this process, the denting amount of the thin plate sections 16a, 16b after the sintering differs depending on the magnitude of the difference in sintering shrinkage speed and/or the difference in sintering shrinkage amount. Therefore, the ceramic green sheets 50A to 50D and the ceramic green sheets 52A, 52B are selected so that the difference in sintering shrinkage speed and/or the difference in sintering shrinkage amount is given with which a desired denting amount is obtained.

When only the thin plate section 16a or 16b disposed on one side, of the pair of thin plate sections 16a, 16b is allowed to previously dent inwardly, it is preferable that the relationship for the ceramic green sheets described above is applied to any one of the ceramic green sheets 52A, 52B.

After that, as shown in FIG. 16B, the ceramic green sheets 50A to 50D, 52A, 52B are laminated and secured under pressure so that the ceramic green sheets 50A to 50D are interposed between the ceramic green sheets 52A, 52B to form a ceramic green laminate 58.

It is necessary to bore a throughhole (not shown) allowing the window 54 to communicate with the external space in the ceramic green laminate 58. This throughhole discharges from the inside of the ceramic green laminate 58 decomposed gases of binders and vapors of the remaining organic solvents or the like generated during the sintering step of the ceramic green laminate 58, so that cracking or unintended deformation, or the like of the thin plate section can be prevented.

Subsequently, as shown in FIG. 16C, the ceramic green laminate 58 is sintered to obtain a ceramic laminate 60. In this process, the ceramic green sheets 50A to 50D are sintered at the timing faster than that of the ceramic green sheets 52A, 52B, and/or the sintering shrinkage amount of the ceramic green sheets 50A to 50D is made smaller than that of the ceramic green sheets 52A, 52B. Therefore, the portions to be formed into the thin plate sections thereafter, of the both first principal surfaces of the ceramic laminate 60 dent inward.

It is noted that there is no limitation for the number of pressure-securing process or processes and the sequence for the purpose of the laminating and integration into one unit. These factors can be appropriately determined depending on the structure, for example, so that the desired structure is obtained on the basis of, for example, the shape of the window 54 and the number of ceramic green sheets.

It is unnecessary that the shape of the window 54 is identical in all cases. The shape of the window 54 can be determined depending on the desired function. There is also no limitation for the number of ceramic green sheets and the thickness of each of the ceramic green sheets.

In the pressure-securing process, it is possible to further improve the laminating performance by applying the heat. The laminating performance at the boundary of the ceramic green sheet can be improved by providing an auxiliary joining layer, for example, by applying and printing, onto the ceramic green sheet, a paste or a slurry principally containing a ceramic powder (it is preferable to use a composition which is the same as or similar to that of the ceramics used for the ceramic green sheet in order to ensure the reliability), and a binder. When the ceramic green sheets 52A, 52B are thin, it is preferable to handle them with a plastic film, especially with a polyethylene terephthalate film coated with a releasing agent based on silicone on the surface.

Figure 17:
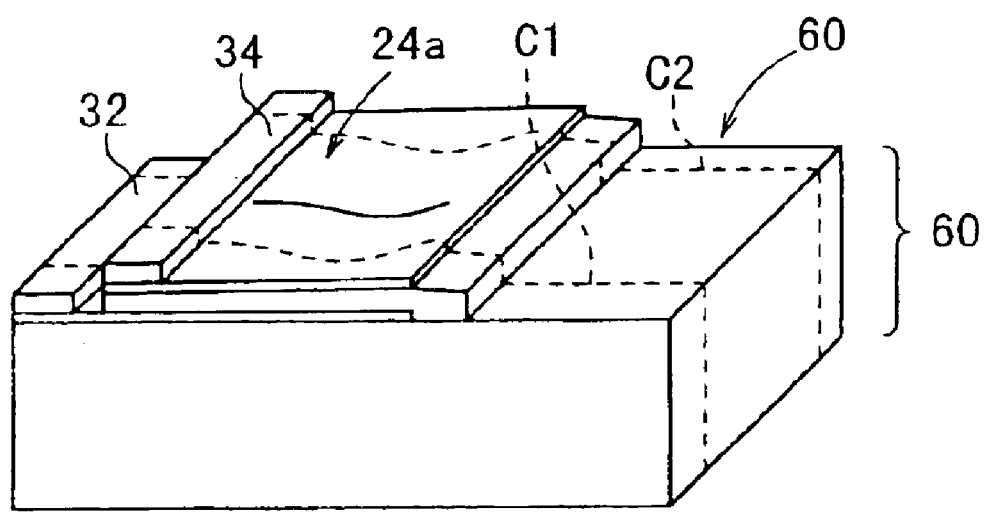
FIG. 17 illustrates a state in which the ceramic green laminate is sintered into the ceramic laminate, and then a piezoelectric/electrostrictive element is formed on the ceramic laminate.

Subsequently, as shown in FIG. 17, the piezoelectric/electrostrictive elements 24a, 24b are formed respectively on the both surfaces of the ceramic laminate 60, i.e., on the surfaces corresponding to the surfaces at which the ceramic green sheets 52A, 52B are laminated. Those usable as the method for forming the piezoelectric/electrostrictive elements 24a, 24b include the thick film formation method such as the screen printing method, the dipping method, the coating method, and the electrophoresis method, and the thin film formation method such as the ion beam method, the sputtering method, the vacuum vapor deposition, the ion plating method, the chemical vapor deposition method (CVD), and the plating.

When the piezoelectric/electrostrictive elements 24a, 24b are formed by using the film formation method as described above, the piezoelectric/electrostrictive elements 24a, 24b and the thin plate sections 16a, 16b can be integrally joined and arranged without using any adhesive. It is possible to ensure the reliability and the reproducibility, and it is easy to form the integration.

In this case, it is preferable that the piezoelectric/electrostrictive elements 24a, 24b are formed by means of the thick film formation method, because of the following reason. That is, especially, when the piezoelectric/electrostrictive layer 26 is formed by using the thick film formation method, the film can be formed by using, for example, a paste, a slurry, a suspension, an emulsion, or a sol containing a major component of particles or powder of piezoelectric ceramics having an average particle size of 0.01 to 5 μm, preferably 0.05 to 3 μm. It is possible to obtain good piezoelectric/electrostrictive characteristics by sintering the formed film.

The electrophoresis method is advantageous in that the film can be formed at a high density with a high shape accuracy. The screen printing method is advantageous to simplify the production step, because it is possible to simultaneously perform the film formation and the pattern formation.

Explanation will be specifically made for the formation of the piezoelectric/electrostrictive elements 24a, 24b. At first, the ceramic green laminate 58 is sintered and integrated into one unit at a temperature of 1200°C. to 1600° C. to obtain the ceramic laminate 60. After that, the first electrodes 28 are printed and sintered at predetermined positions on the both surfaces of the ceramic laminate 60. Subsequently, the piezoelectric/electrostrictive layers 26 are printed and sintered. Further, the second electrodes 30 are printed and sintered to form the piezoelectric/electrostrictive elements 24a, 24b. After that, the terminals 32, 34 are printed and sintered in order to electrically connect the respective electrodes 28, 30 to the driving circuit.

In this process, when the materials are selected so that the sintering temperature for each of the members is lowered in accordance with the stacking sequence, for example, when platinum (Pt) is used for the first electrode 28, lead zirconate titanate (PZT) is used for the piezoelectric/electrostrictive layer 26, gold (Au) is used for the second electrode 30, and silver (Ag) is used for the terminals 32, 34, then the material, which has been already sintered beforehand, is not sintered again at a certain sintering stage. Thus, it is possible to avoid the occurrence of inconvenience such as peeling off and aggregation of the electrode material or the like.

When appropriate materials are selected, it is also possible to successively print the respective members of the piezoelectric/electrostrictive elements 24a, 24b and the terminals 32, 34, followed by the sintering one time. Further, it is also possible to provide, for example, the respective electrodes 30 at a low temperature after forming the piezoelectric/electrostrictive layers 26.

The sintering temperature of the constitutive film of the piezoelectric/electrostrictive elements 24a, 24b is appropriately determined depending on the material for constructing the same. However, the sintering temperature is generally 500° C. to 1500° C. The sintering temperature is preferably 1000° C. to 1400° C. for the piezoelectric/electrostrictive layer 26. In this case, in order to control the composition of the piezoelectric/electrostrictive layer 26, the sintering is preferably performed in the presence of an evaporation source of the material of the piezoelectric/electrostrictive layer 26.

It is also preferable that the respective members of the piezoelectric/electrostrictive elements 24a, 24b and the terminals 32, 34 are formed in accordance with the thin film formation method such as the sputtering method and the vapor deposition method. In this case, it is not necessarily indispensable to perform the heat treatment.

Figure 18:
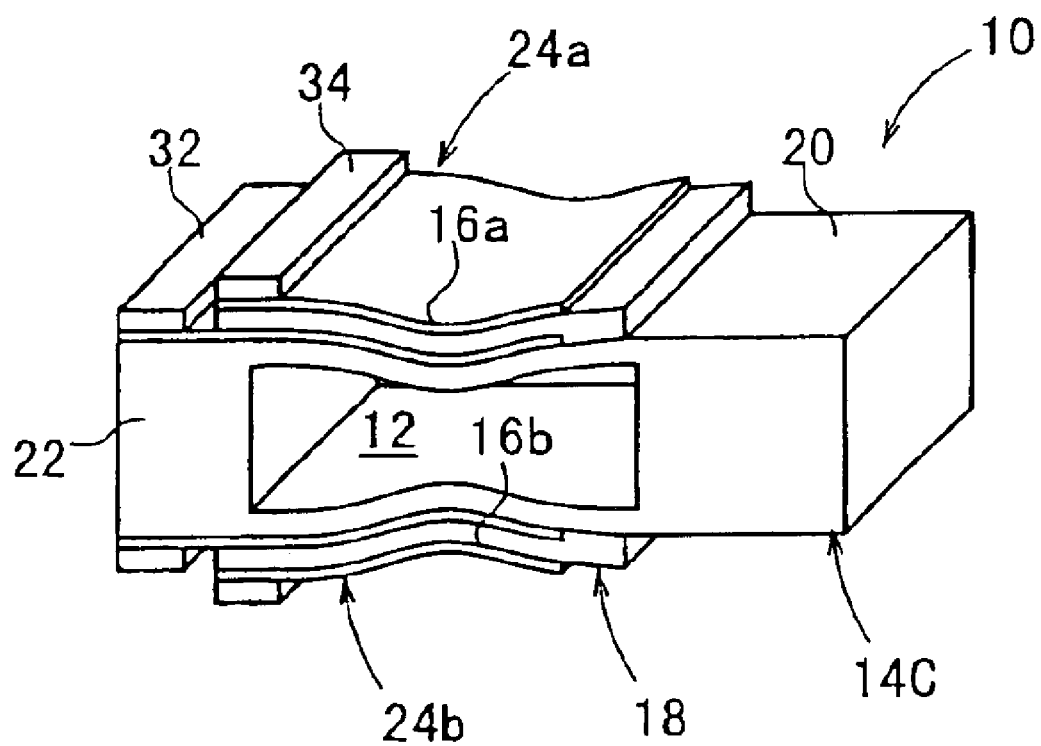
FIG. 18 illustrates a state in which the ceramic laminate is cut along predetermined cutting lines to provide the piezoelectric/electrostrictive device according to the embodiment of the present invention.

Subsequently, unnecessary portions are cut off from the ceramic laminate 60 formed with the piezoelectric/electrostrictive elements 24a, 24b as described above. The cutoff positions are located at side portions of the ceramic laminate 60, especially at portions at which the hole 12 based on the window 54 is formed on the side surfaces of the ceramic laminate 60 by means of the cutoff (see cutting lines C1 and C2). As a result of the cutoff, as shown in FIG. 18, the piezoelectric/electrostrictive device 10 according to the embodiment of the present invention is completed, in which the piezoelectric/electrostrictive elements 24a, 24b are formed on the ceramic substrate 14C wherein the pair of thin plate sections 16a, 16b are respectively bent in the directions to make mutual approach so that the inwardly convex configuration to the hole is given.

Those applicable as the cutoff method include the mechanical machining such as the dicing machining, the wire saw machining and the slicing machining as well as the electron beam machining and the laser machining based on the use of, for example, the YAG laser and the excimer laser. When the cutoff is performed, it is preferable that the heat treatment is performed at 300 to 800° C. after the cutoff, because of the following reason. That is, any defect such as microcrack tends to occur in the device as a result of the machining, while the defect can be removed by means of the heat treatment described above, and the reliability is improved. Further, it is preferable to apply the aging treatment by being left to stand for at least 10 hours at a temperature of about 80° C. after the heat treatment, because of the following reason. That is, when the aging treatment is performed, for example, the various stresses, which have been exerted during the production process, can be mitigated to contribute to the improvement in characteristic.

Figure 19A:
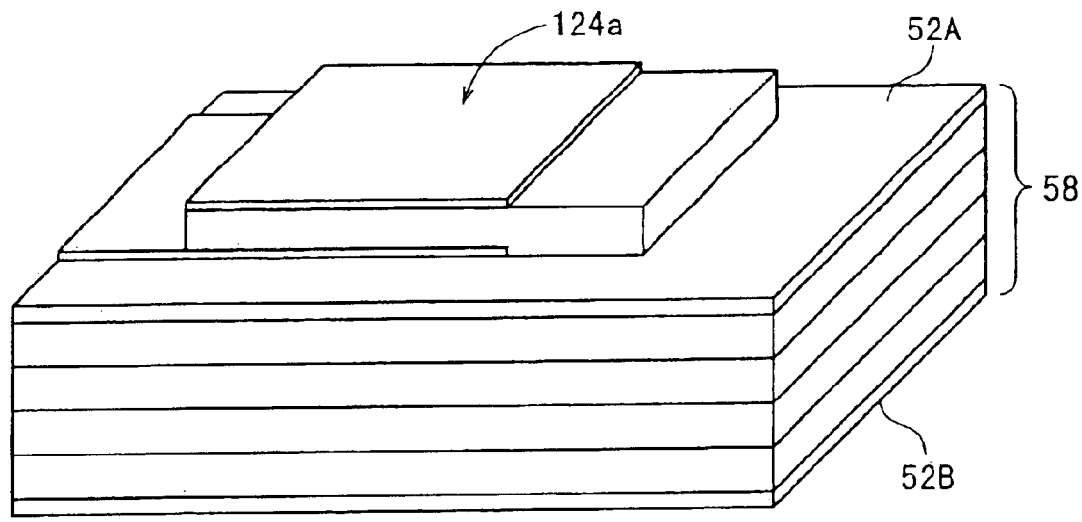
FIG. 19A illustrates a state in which a precursor of a piezoelectric/electrostrictive element is formed on a ceramic green laminate in a second production method.

Next, a second production method will be explained with reference to FIGS. 19A to 19B. In the second production method, as shown in FIG. 19A, precursors 124a, 124b of the piezoelectric/electrostrictive elements 24a, 24b are formed on both surfaces of the ceramic green laminate 58, i.e., on the respective surfaces of the ceramic green sheets 52A, 52B.

In this process, the formation is made while making the control such that the difference in thermal expansion is smaller in the thin plate sections 16a, 16b, concerning the material for the portions to be formed into at least the thin plate sections 16a, 16b and the material for the precursors 124a, 124b of the piezoelectric/electrostrictive elements 24a, 24b. Preferably, it is desirable to make the adjustment and control so that the ratio of coefficient of thermal expansion between the materials (the ratio of the coefficient of thermal expansion of the precursors 124a, 124b of the piezoelectric/electrostrictive elements 24a, 24b to the coefficient of thermal expansion of the material for constructing the thin plate sections 16a, 16b) is within a range of 1 to 10.

Figure 19B:
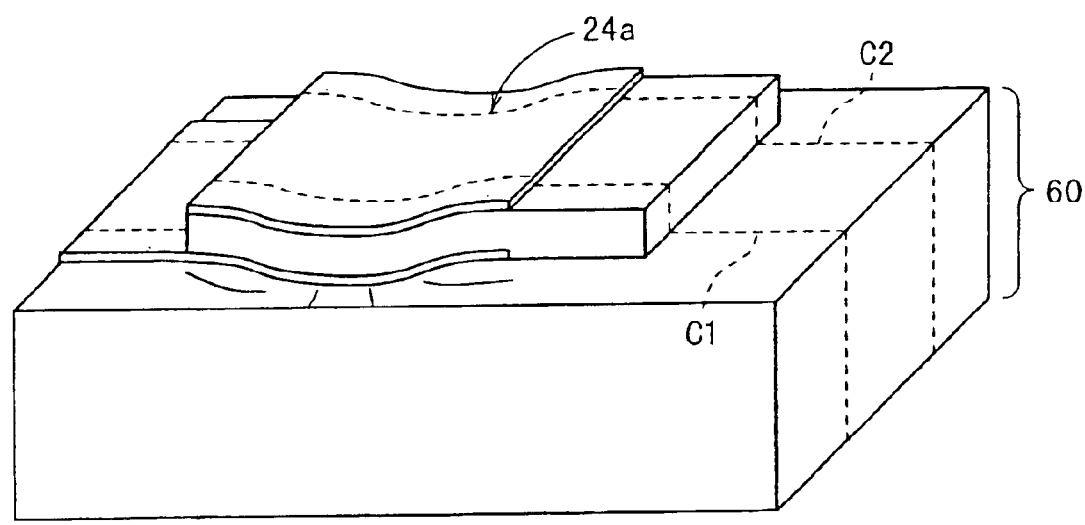
FIG. 19B illustrates a state in which the ceramic green laminate and the precursor of the piezoelectric/electrostrictive element are co-fired to form the piezoelectric/electrostrictive element on a ceramic laminate.

Accordingly, when the ceramic green laminate 58 and the precursors 124a, 124b of the piezoelectric/electrostrictive elements 24a, 24b are co-fired to convert the ceramic green laminate 58 into the ceramic laminate 60 as shown in FIG. 19B, the following arrangement is consequently obtained. That is, the portions to be formed into the thin plate sections 16a, 16b thereafter of the ceramic laminate 60 inwardly dent, and the piezoelectric/electrostrictive elements 24a, 24b are formed on the portions to be formed into the thin plate sections 16a, 16b, owing to the difference in thermal expansion at least between the material for the portions to be formed into the thin plate sections 16a, 16b and the material for the precursors 124a, 124b of the piezoelectric/electrostrictive elements 24a, 24b.

When the foregoing co-firing is performed, it is also preferable to perform the sintering of the ceramic green laminate 58 and for all of the constitutive films of the piezoelectric/electrostrictive elements 24a, 24b. For example, other methods are available as follows. That is, the first electrode 28 and the ceramic green laminate 58 are co-fired. Alternatively, the other constitutive films except for the second electrode 30 and the ceramic green laminate 58 are co-fired.

In other words, the precursors 124a, 124b of the piezoelectric/electrostrictive elements 24a, 24b refer to all of the constitutive films of the piezoelectric/electrostrictive elements 24a, 24b before the sintering, or the other constitutive films except for the second electrode 30 of the piezoelectric/electrostrictive elements 24a, 24b before the sintering.

The following method is available to co-fire the piezoelectric/electrostrictive elements 24a, 24b and the ceramic green laminate 58. That is, precursors of the piezoelectric/electrostrictive layers 26 are formed, for example, in accordance with the tape formation method based on the use of a slurry material. The precursors of the piezoelectric/electrostrictive layers 26 before the sintering are laminated on the surfaces of the ceramic green laminate 58, for example, by means of the thermal securing process under pressure, followed by the co-firing to simultaneously produce the movable section 20, the thin plate sections 16a, 16b, the piezoelectric/electrostrictive layers 26, and the fixation section 22. However, in this method, it is necessary to form the electrodes 28 on the surfaces of the ceramic green laminate 58 and/or on the piezoelectric/electrostrictive layers 26 by using the film formation method described above.

Another method is also available. That is, the electrodes 28, 30 and the piezoelectric/electrostrictive layers 26, which are the respective constitutive layers of the piezoelectric/electrostrictive elements 24a, 24b, are formed by means of the screen printing on portions to be finally formed into at least the thin plate sections 16a, 16b of the ceramic green laminate 58, followed by the co-firing.

When the piezoelectric/electrostrictive layers 26 and the ceramic green laminate 58 are co-fired, it is necessary to conform the sintering conditions of the both. The piezoelectric/electrostrictive elements 24a, 24b are not necessarily formed on the both surfaces of the ceramic laminate 60 or the ceramic green laminate 58. It is of course allowable to form the piezoelectric/electrostrictive elements 24a, 24b on only one surface.

Subsequently, as shown in FIG. 19B, the ceramic laminate 60, which is formed with the piezoelectric/electrostrictive elements 24a, 24b, is cut along cutting lines C1 and C2 to cut off side portions of the ceramic laminate 60. According to the cutoff, as shown in FIG. 18, the piezoelectric/electrostrictive device 10 according to the embodiment of the present invention is completed.

Figure 20A:
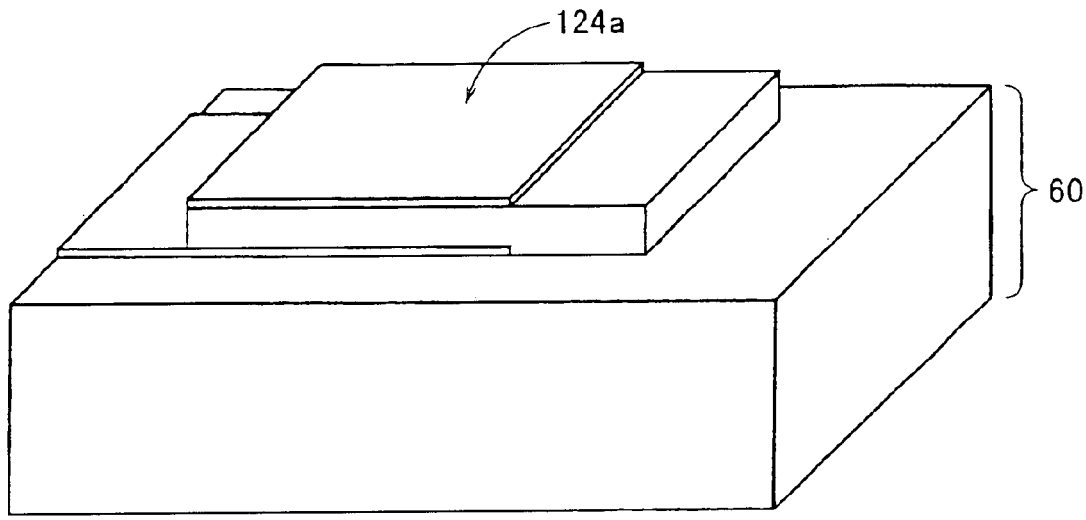
FIG. 20A illustrates a process in a third production method in which a precursor of the piezoelectric/electrostrictive element is formed on the ceramic laminate.

Next, a third production method will be explained with reference to FIGS. 20A to 20B. In the above-described first production method, with respect to the surface of the ceramic laminate 60 on which the piezoelectric/electrostrictive elements 24a, 24b are formed, the portions to be formed into the thin plate sections 16a, 16b are dented (see FIG. 16C). In this third production method, as shown in FIG. 20A, the ceramic laminate 60 in which the surfaces to be formed into the thin plate sections 16a, 16b are made flat is used as the ceramic laminate 60 in which the piezoelectric/electrostrictive elements 24a, 24b are formed, and the precursors 124a, 124b of the piezoelectric/electrostrictive elements 24a, 24b are formed on the surface of the ceramic laminate 60 according to the above-described process, for example, the screen printing method.

Figure 20B:
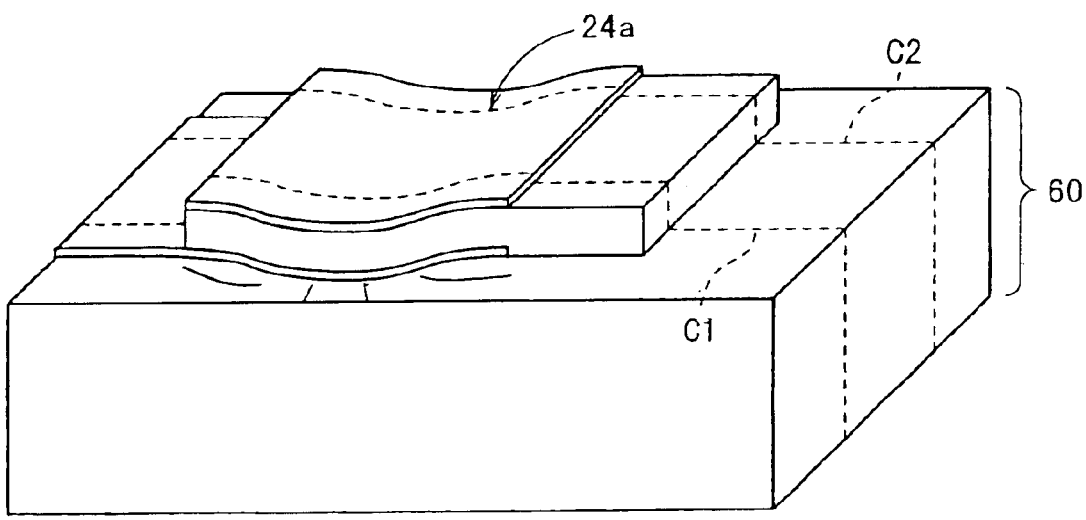
FIG. 20B illustrates a state in which the precursor of the piezoelectric/electrostrictive element is sintered to form the piezoelectric/electrostrictive element on the ceramic laminate.

Subsequently, as shown in FIG. 20B, the precursors 124a, 124b of the piezoelectric/electrostrictive elements 24a, 24b are sintered and integrated with the ceramic laminate 60. At this time, the respective materials are selected such that a ratio of coefficient of thermal expansion between the portions to be formed into the thin plate sections 16a, 16b of the ceramic laminate 60 and the precursors 124a, 124b of the piezoelectric/electrostrictive elements 24a, 24b (the ratio of the coefficient of thermal expansion of the precursors 124a, 124b of the piezoelectric/electrostrictive elements 24a, 24b to the coefficient of thermal expansion of the material for constructing the thin plate sections 16a, 16b) is within a range of from 0.05 to 2, whereby the ceramic laminate 60 having a desired shape can be obtained at the same time when the precursors 124a, 124b are sintered.

The precursors 124a, 124b as referred to herein means objects to be sintered for forming any one of the pair of electrodes 28, 30 (or both of electrodes 28, 30) constituting the piezoelectric/electrostrictive elements 24a, 24b; and/or for forming the piezoelectric/electrostrictive layer 26.

Subsequently, as shown in FIG. 20B, the ceramic laminate 60 on which the piezoelectric/electrostrictive elements 24a, 24b are formed is cut along cutting lines C1 and C2, thereby cutting off side portions of the ceramic laminate 60. By this cutting, the piezoelectric/electrostrictive device according to the present invention is completed, as shown in FIG. 18.

The embodiments of the first to third production methods described above are illustrative of the case in which the movable section 20, the fixation section 22, and the thin plate sections 16a, 16b are constructed by the ceramic substrate 14C. Alternatively, each of the parts may be made of a metal material. Further alternatively, each of the parts may be made to provide a hybrid structure obtained by combining those produced with materials of ceramics and metal. In this case, in order to join the metal materials to one another and/or join the ceramic and metal materials to one another, for example, it is possible to use adhesion with organic resin or glass, brazing, soldering, eutectic bonding, or welding.

Explanation will be made with reference to FIGS. 21A to 27, for example, for production methods (fourth and fifth production methods) for piezoelectric/electrostrictive devices (piezoelectric/electrostrictive devices 10j and 10k according to tenth and eleventh modified embodiments) having the hybrid structure in which the movable section 20 and the fixation section 22 are made of ceramics, and the thin plate sections 16a, 16b are made of metal. The substrate containing metal and ceramics, which is produced by the fourth and fifth production methods, is referred to as the substrate 14D.

Figure 21A:
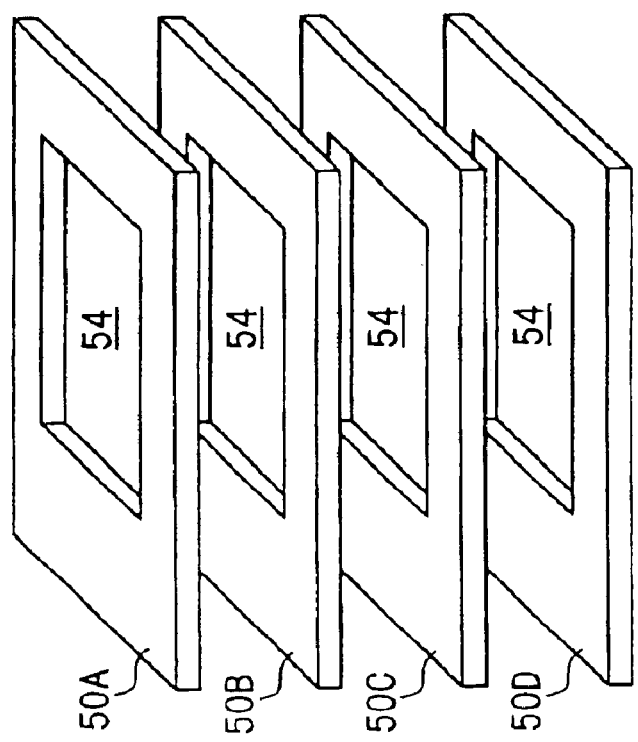
FIG. 21A illustrates a process for laminating necessary ceramic green sheets when the piezoelectric/electrostrictive device according to a tenth modified embodiment is produced in accordance with a fourth production method.

In the fourth production method, at first, as shown in FIG. 21A, a plurality (for example, four) of frame-shaped ceramic green sheets 50A to 50D, each of which is formed with a window 54 for forming at least the hole 12 thereafter, are prepared.

Figure 21B:
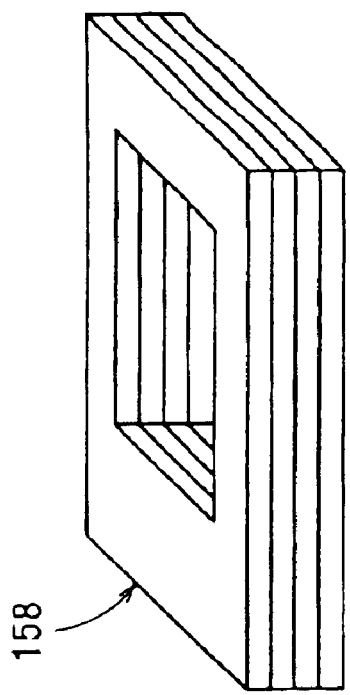
FIG. 21B illustrates a state in which a ceramic green laminate is formed.

After that, as shown in FIG. 21B, the ceramic green sheets 50A to 50D are laminated and secured under pressure to form a ceramic green laminate 158 having no thin plate (having no portions to be formed into the thin plate sections 16a, 16b thereafter). After that, as shown in FIG. 22A, the ceramic green laminate 158 having no thin plate is sintered to obtain a ceramic laminate 160 having no thin plate. At this stage, the ceramic laminate 160 having no thin plate (having no portions to be formed into the thin plate sections 16a, 16b thereafter) is formed such that the hole 130 is formed by the windows 54.

Figure 22B:
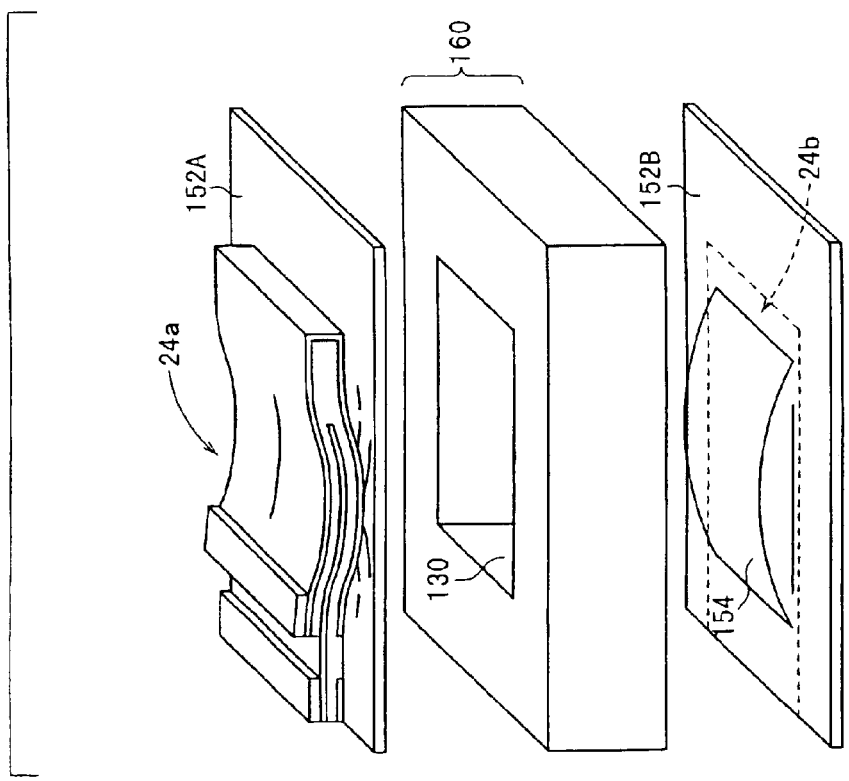
FIG. 22B illustrates a state in which piezoelectric/electrostrictive elements, which are constructed as other members, are bonded to surfaces of metal plates to serve as thin plate sections respectively.
Figure 22A:
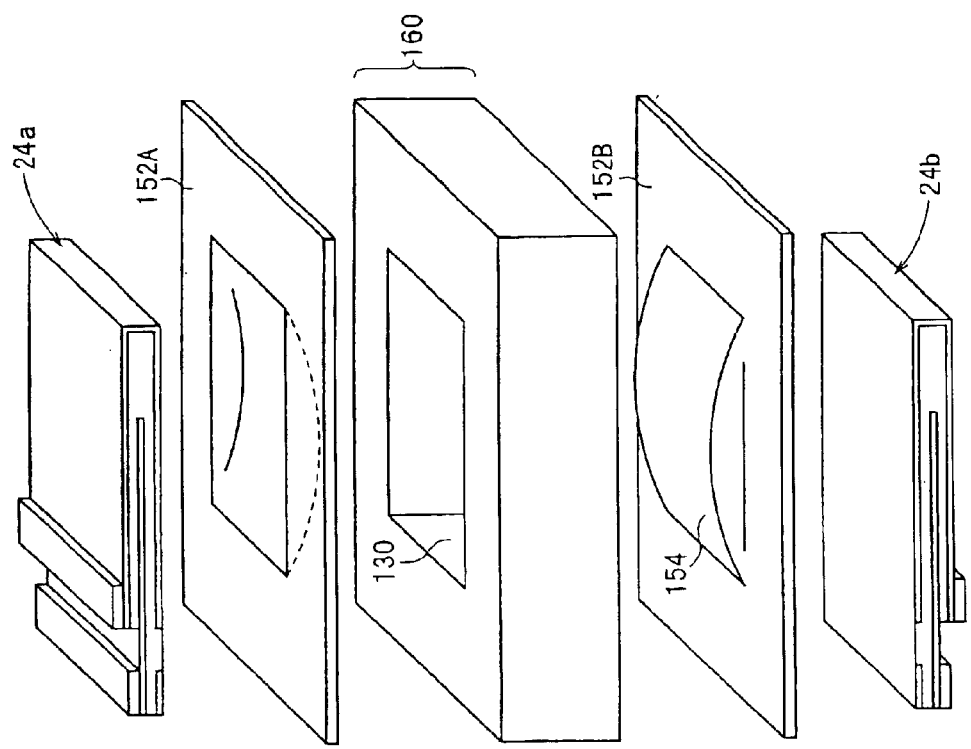
FIG. 22A illustrates a state in which the ceramic green laminate is sintered to produce a ceramic laminate.

Subsequently, as shown in FIG. 22B, the piezoelectric/electrostrictive elements 24a, 24b, which are constructed as separate members, are respectively bonded with an epoxy adhesive to the surfaces of metal plates 152A, 152B to serve as the thin plate sections. In this case, those used as the metal plates 152A, 152B are obtained by forming 154 by previously allowing the portions to be formed into the thin plate sections 16a, 16b to dent in the certain direction, for example, by means of press working. The embodiment shown in FIG. 22B is illustrative of the case in which parts of the metal plates 152A, 152B are allowed to dent to give a concave configuration respectively. The separate members of the piezoelectric/electrostrictive elements 24a, 24b can be formed, for example, in accordance with the ceramic green sheet-laminating method. In this case, it is also preferable that the precursors 124a, 124b of the piezoelectric/electrostrictive elements 24a, 24b are allowed to make dent by means of tooling or the like in the same manner as in the metal plates 152A, 152B described above.

Subsequently, the metal plates 152A, 152B are bonded to the ceramic laminate 160 with the epoxy adhesive so that the ceramic laminate 160 is interposed between the metal plates 152A, 152B and the hole 130 is closed thereby to provide a hybrid laminate 162 (see FIG. 23).

Figure 23:
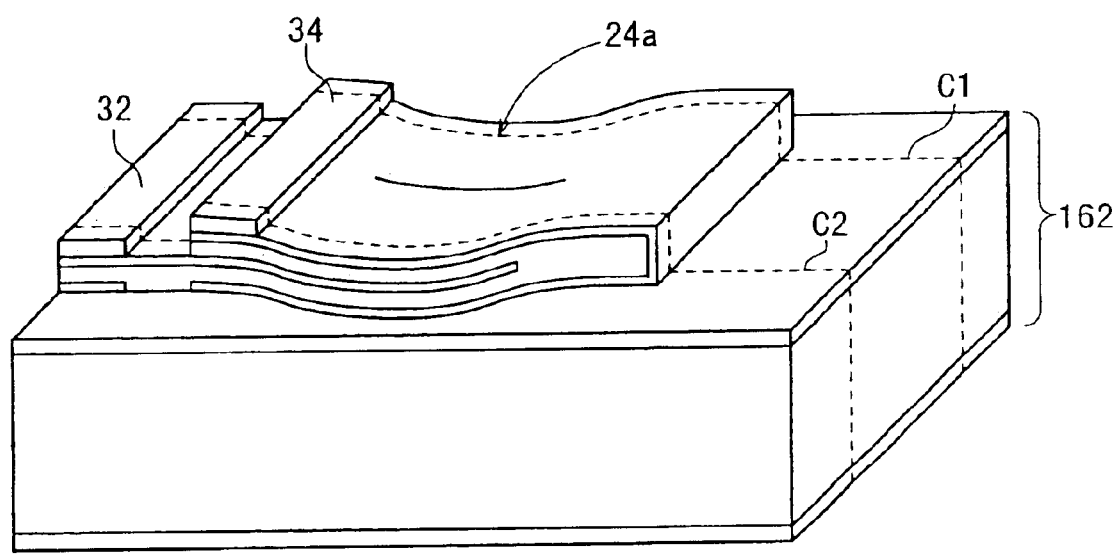
FIG. 23 illustrates a state in the fourth production method in which the metal plates are bonded to the ceramic laminate to provide a hybrid laminate.
Figure 24:
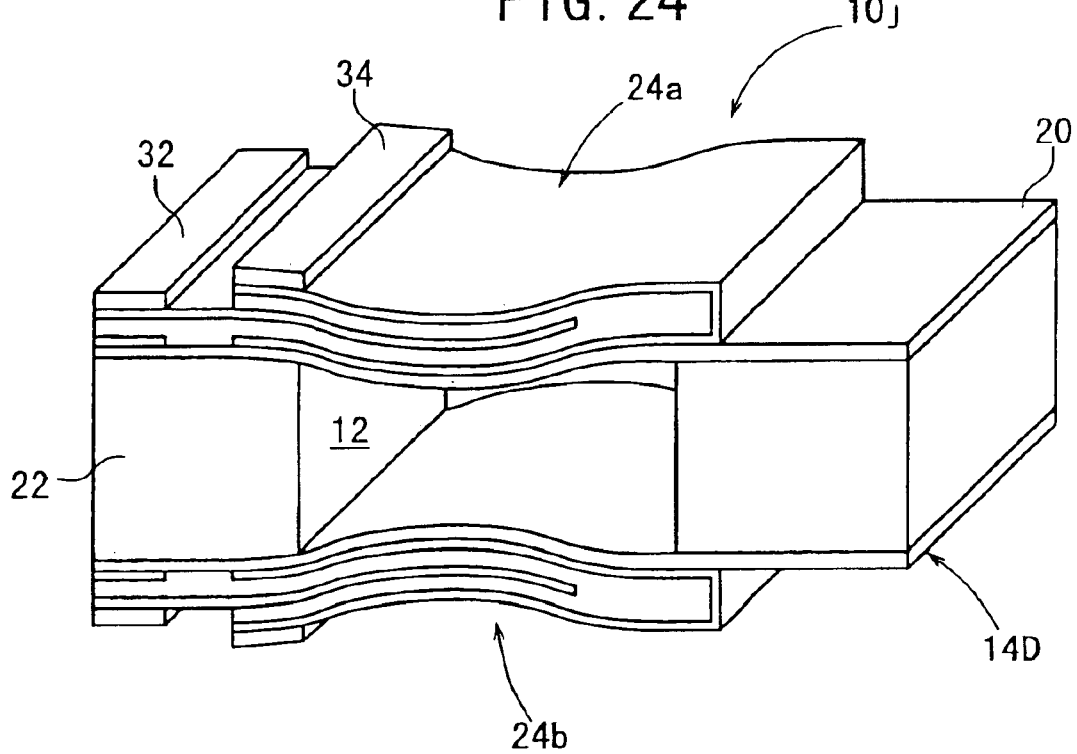
FIG. 24 illustrates a state in the fourth production method in which the hybrid laminate is cut along predetermined cutting lines to provide a piezoelectric/electrostrictive device according to the tenth modified embodiment.

Subsequently, as shown in FIG. 23, the hybrid laminate 162, which is formed with the piezoelectric/electrostrictive elements 24a, 24b, is cut along cutting lines C1 and C2 to thereby cut off side portions of the hybrid laminate 162. As a result of the cutoff, as shown in FIG. 24, the piezoelectric/electrostrictive device 10j according to the tenth modified embodiment is completed, in which the piezoelectric/electrostrictive elements 24a, 24b are formed on the substrate 14D wherein the thin plate sections 16a, 16b constructed by the metal plates 152A, 152B are previously bent in the directions to make approach to each other to give the convex configuration toward the hole 12.

On the other hand, in the fifth production method, at first, in the same manner as in the fourth production method described above, a plurality (for example, four) of frame-shaped ceramic green sheets 50A to 50D, each of which is formed with a window 54 for forming at least the hole 12 thereafter, are prepared. The ceramic green sheets 50A to 50D are laminated and secured under pressure to form a ceramic green laminate 158 having no thin plate (see FIGS. 21A, 21B).

Figure 25A:
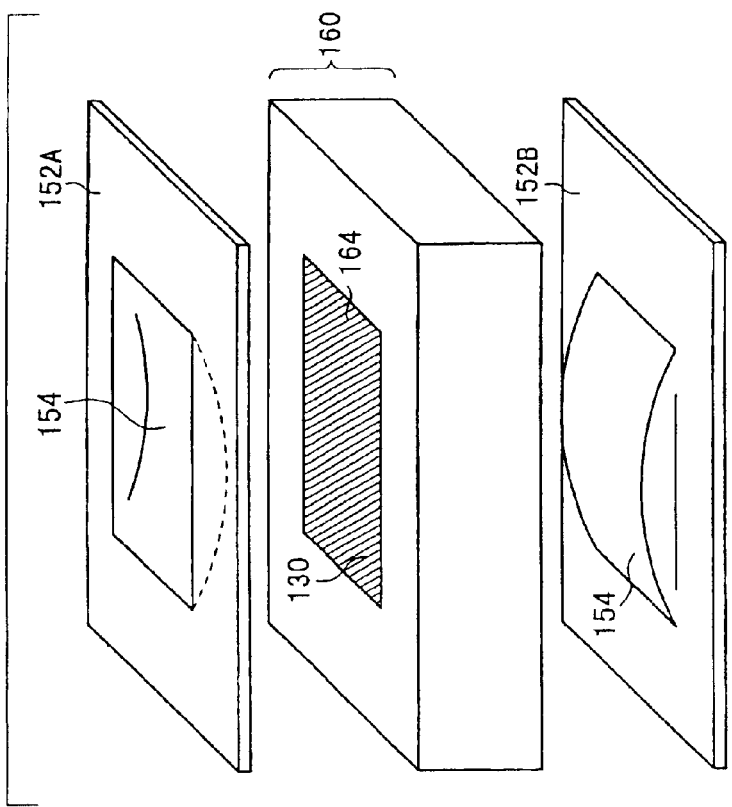
FIG. 25A illustrates a state in which a ceramic green laminate is sintered to produce a ceramic laminate in a fifth production method.

Subsequently, the ceramic green laminate 158 having no thin plate is sintered to obtain a ceramic laminate 160 as shown in FIG. 25A. At this stage, the ceramic laminate 160 having no thin plate is formed such that the hole 130 is formed by the windows 54.

Figure 25B:
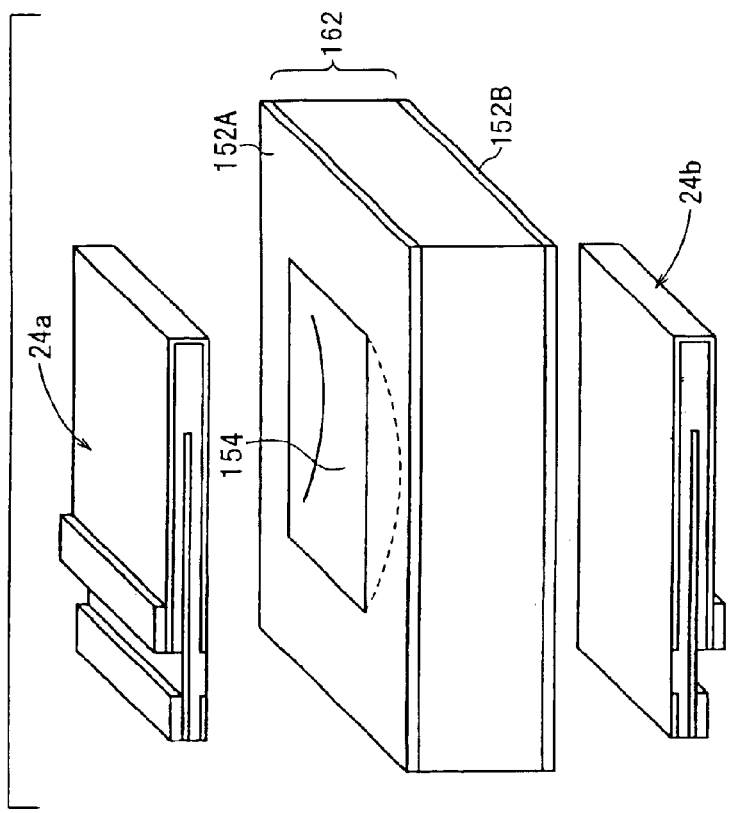
FIG. 25B illustrates a state in which the metal plates are bonded to the ceramic laminate to provide a hybrid laminate.

Subsequently, as shown in FIG. 25B, the metal plates 152A, 152B are bonded to the ceramic laminate 160 having no thin plate with an epoxy adhesive so that the ceramic laminate 160 having no thin plate is interposed between the metal plates 152A, 152B and the hole 130 is closed thereby to provide a hybrid laminate 162. Also in this case, those used for the metal plates 152A, 152B are obtained by previously allowing the portions to be formed into the thin plate sections 16a, 16b thereafter to dent in the certain directions by means of press working or the like.

Further, in order to apply a sufficient force for bonding during laminating the piezoelectric/electrostrictive elements 24a, 24b on the surfaces of the adhered metal plates 152A, 152B, a filler material 164 is filled in the hole 130, if desired, as shown in FIG. 25A.

It is necessary to finally remove the filler material 164. Therefore, it is preferable to use a hard material which is easily dissolved in a solvent or the like. The material includes, for example, organic resin, wax, and brazing filler material. It is also possible to adopt a material obtained by mixing ceramic powder as a filler with organic resin such as acrylic.

Figure 26:
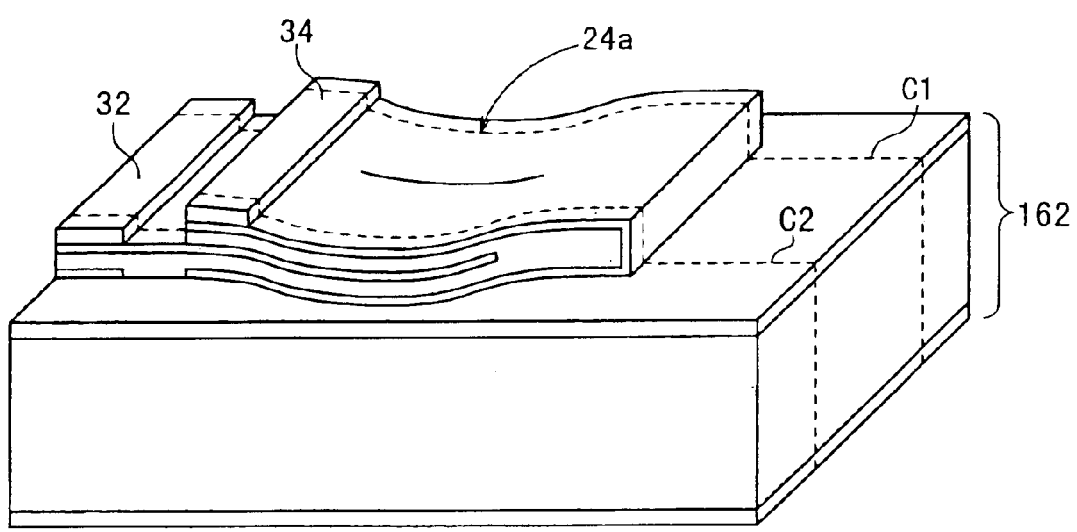
FIG. 26 illustrates a state in the fifth production method in which piezoelectric/electrostrictive elements, which are constructed as other members, are bonded to surfaces of metal plates to serve as thin plate sections respectively.

Subsequently, as shown in FIG. 26, the piezoelectric/electrostrictive elements 24a, 24b, which are constructed as separate members, are bonded with an epoxy adhesive to the surfaces of the metal plates 152A, 152B of the hybrid laminate 162. The separate members of the piezoelectric/electrostrictive elements 24a, 24b can be formed, for example, in accordance with the ceramic green sheet-laminating method.

Figure 27:
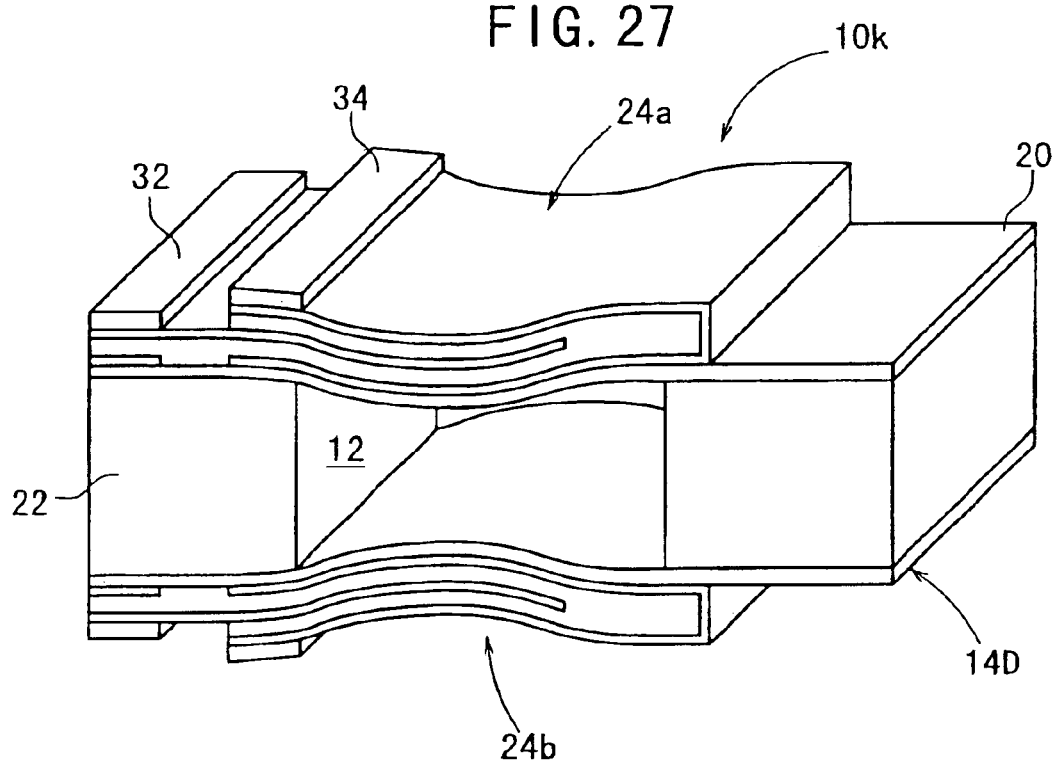
FIG. 27 illustrates a state in the fifth production method in which the hybrid laminate is cut along predetermined cutting lines to provide a piezoelectric/electrostrictive device according to an eleventh modified embodiment.
Figure 28:
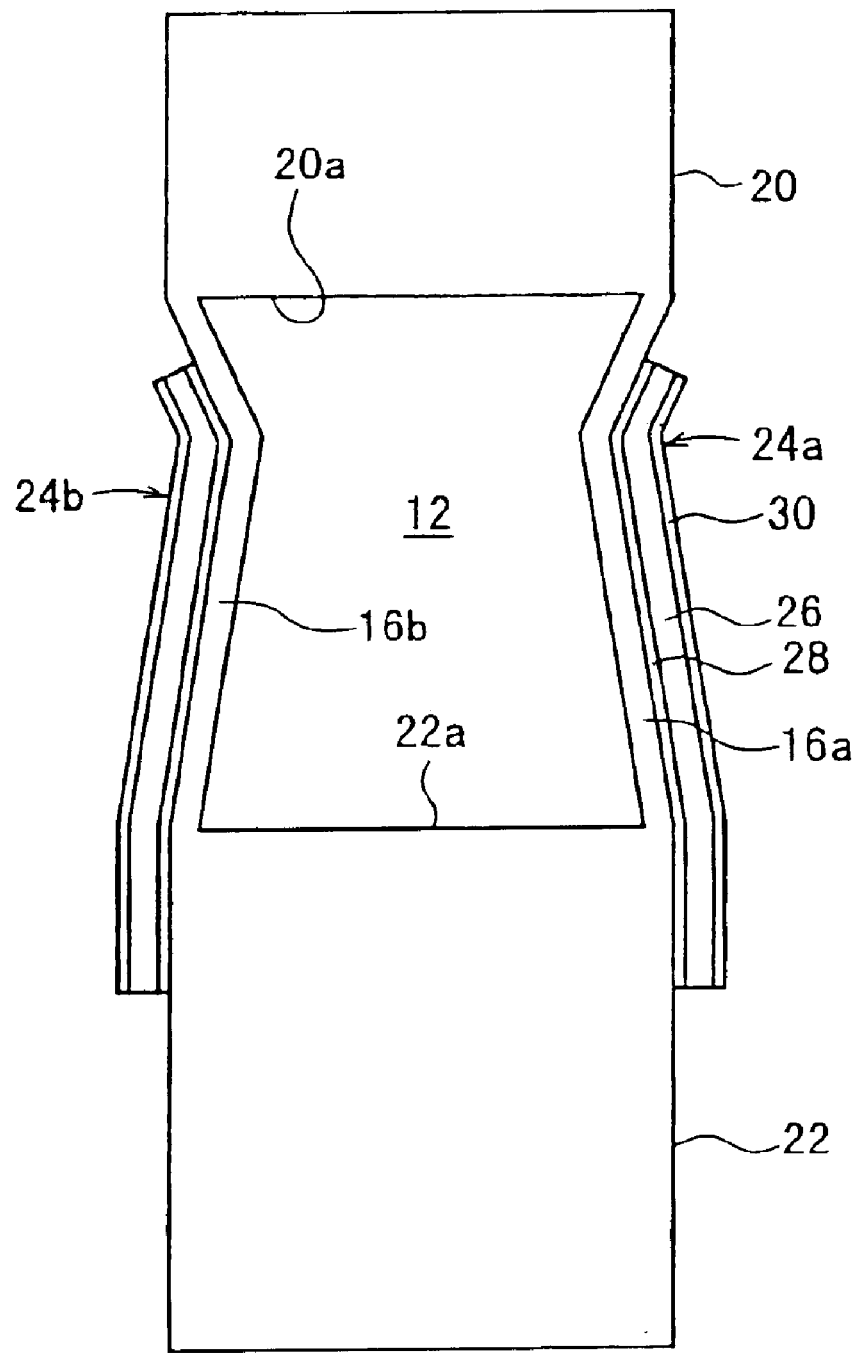
FIG. 28 shows a front view illustrating an arrangement of a piezoelectric/electrostrictive device according to a twelfth modified embodiment.
Figure 29:
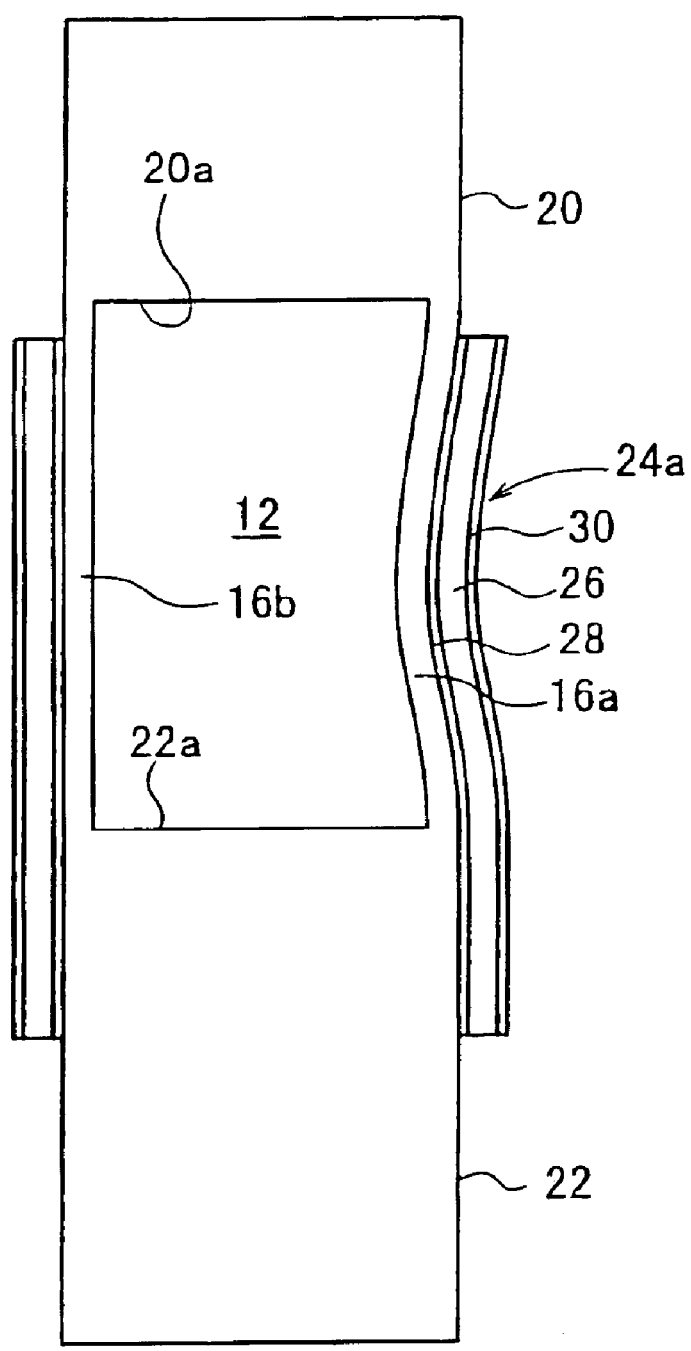
FIG. 29 shows a front view illustrating an arrangement of a piezoelectric/electrostrictive device according to a thirteenth modified embodiment.
Figure 30:
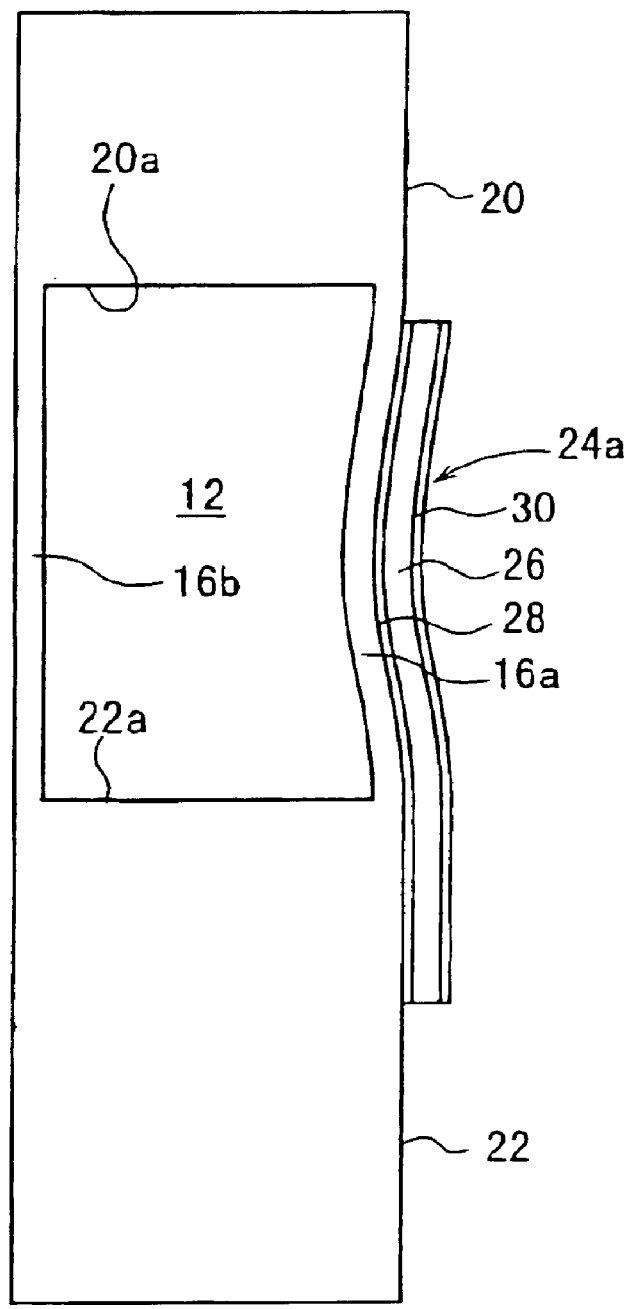
FIG. 30 shows a front view illustrating an arrangement of a piezoelectric/electrostrictive device according to a fourteenth modified embodiment.
Figure 31:
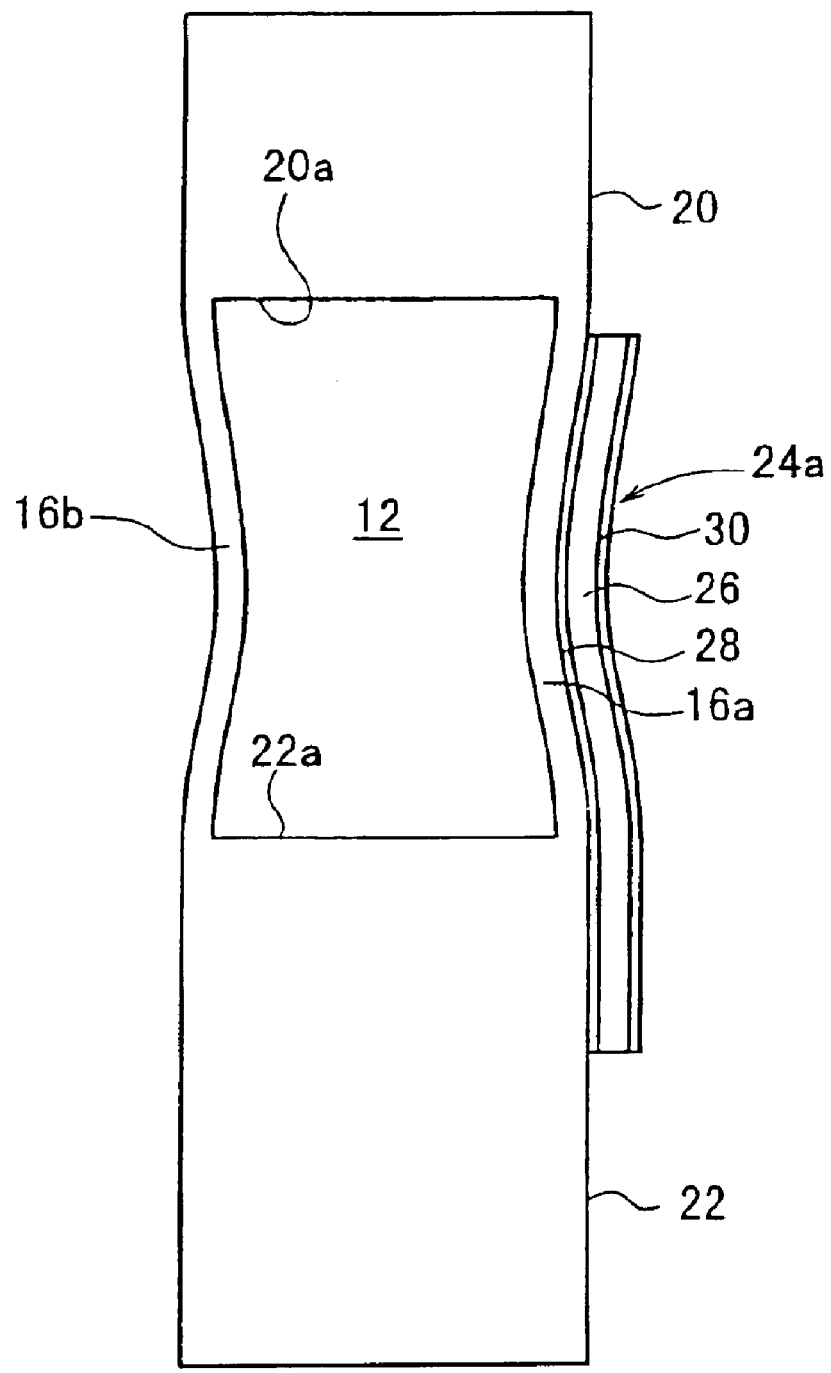
FIG. 31 shows a front view illustrating an arrangement of a piezoelectric/electrostrictive device according to a fifteenth modified embodiment.
Figure 32:
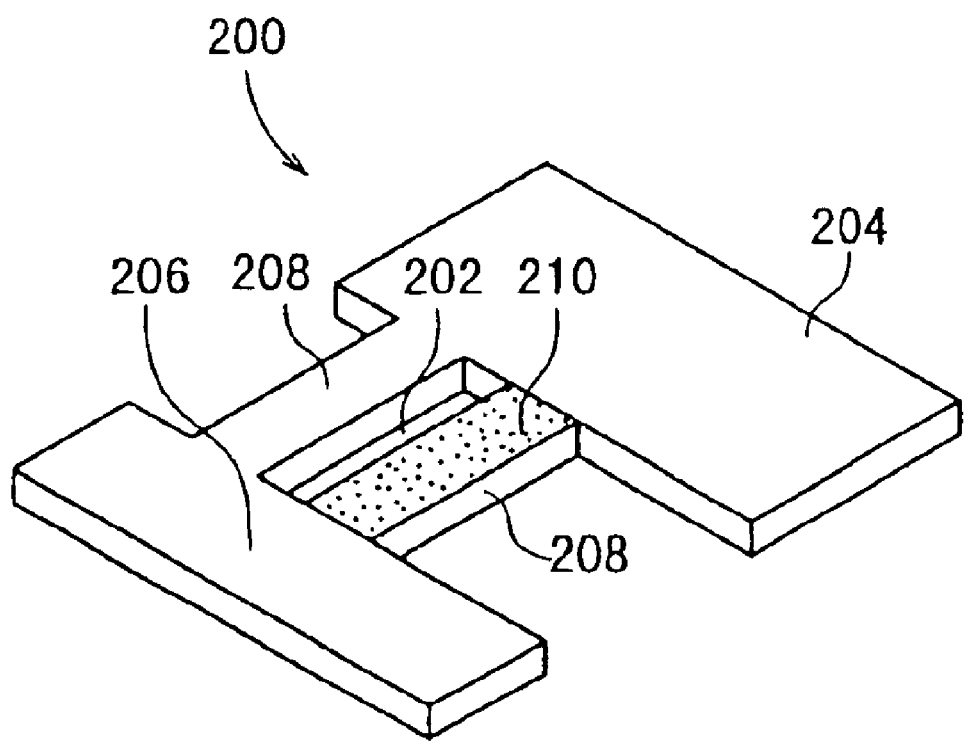
FIG. 32 shows an arrangement of a piezoelectric/electrostrictive device concerning an illustrative conventional technique.

Subsequently, the hybrid laminate 162, which is formed with the piezoelectric/electrostrictive elements 24a, 24b, is cut along cutting lines C1 and C2 to thereby cut off side portions of the hybrid laminate 162. As a result of the cutoff, as shown in FIG. 27, the piezoelectric/electrostrictive device 10k according to the eleventh modified embodiment is obtained, in which the piezoelectric/electrostrictive elements 24a, 24b are formed on the substrate 14D wherein the thin plate sections 16a, 16b constructed by the metal plates 152A, 152B are previously bent in the directions to make mutual approach to give the convex configuration toward the hole 12.

When all of the substrate section is made of metal, for example, the portions corresponding to the ceramic laminate 160 shown in FIG. 22A are formed by means of molding. Further, thin metal materials may be stacked to form the substrate section in accordance with the cladding method.

The various piezoelectric/electrostrictive devices described above are illustrative of the case in which the central portions of the thin plate sections 16a, 16b dent inwardly. However, as in a piezoelectric/electrostrictive device 10m according to a twelfth modified embodiment shown in FIG. 28, it is also preferable that portions other than the central portions of the thin plate sections 16a, 16b may dent inwardly. This structure can be formed with ease, for example, by means of press working when the thin plate sections 16a, 16b are made of metal. Alternatively, the structure can be similarly formed such that the thin plate sections 16a, 16b are formed to be flat beforehand, and then they are pressed from the outside toward of the hole 12.

The embodiments described above are illustrative of the case in which both of the pair of thin plate sections 16a, 16b are bent inwardly, and the piezoelectric/electrostrictive elements 24a, 24b are formed on both of the thin plate sections 16a, 16b. Alternatively, as in a piezoelectric/electrostrictive device 10n according to a thirteenth modified embodiment shown in FIG. 29, for example, it is also preferable that only the first thin plate section 16a is bent inwardly, and the piezoelectric/electrostrictive elements 24a, 24b are formed on both of the thin plate sections 16a, 16b respectively. Alternatively, as in a piezoelectric/electrostrictive device 10p according to a fourteenth modified embodiment shown in FIG. 30, it is also preferable that only the first thin plate section 16a is bent inwardly, and the piezoelectric/electrostrictive element 24a is formed on the first thin plate section 16a. Further alternatively, as in a piezoelectric/electrostrictive device 10q according to a fifteenth modified embodiment shown in FIG. 31, it is also preferable that both of the pair of thin plate sections 16a, 16b are bent inwardly, and the piezoelectric/electrostrictive element 24a is formed on the first thin plate section 16a of them.

The piezoelectric/electrostrictive devices 10p, 10q, in which the piezoelectric/electrostrictive element 24a is formed on only one thin plate section 16a of the pair of mutually opposing thin plate sections 16a, 16b as described above, make it possible to decrease the rigidity of the thin plate section 16b on which the piezoelectric/electrostrictive element 24b is not formed.

As a result, comparison may be made concerning the magnitude of the displacement obtained by operating one piezoelectric/electrostrictive element 24a, between the piezoelectric/electrostrictive device (for example, piezoelectric/electrostrictive device 10) in which the piezoelectric/electrostrictive elements 24a, 24b are formed on the both sides and the piezoelectric/electrostrictive device (10p or 10q) in which the piezoelectric/electrostrictive element 24a is formed on only one side. The piezoelectric/electrostrictive device (10p or 10q), in which the piezoelectric/electrostrictive element 24a is formed on only one side, has such a feature that it is possible to obtain the greater displacement, owing to the effect that the rigidity of the thin plate section 16b disposed on the opposed side is low.

The piezoelectric/electrostrictive device described above can be utilized as the active device including, for example, various transducers, various actuators, frequency region functional parts (filters), transformers, vibrators, resonators, oscillators, and discriminators for the communication and the power generation, as well as the sensor element for various sensors including, for example, ultrasonic sensors, acceleration sensors, angular velocity sensors, shock sensors, and mass sensors. Especially, the piezoelectric/electrostrictive device described above can be preferably utilized for various actuators to be used for the mechanism for adjusting the displacement and the positioning and for adjusting the angle for various precision parts such as those of optical instruments and precision mechanical equipments.

It is a matter of course that the piezoelectric/electrostrictive device and the method for producing the same according to the present invention are not limited to the embodiments described above, which may be embodied in other various forms without deviating from the gist or essential characteristics of the present invention.

What is claimed is:

1. A method for producing a piezoelectric/electrostrictive device comprising:

a pair of mutually opposing thin plate sections, a movable section, and a fixation section for supporting said thin plate sections and said movable section;

one or more piezoelectric/electrostrictive elements arranged on at least one thin plate section of said pair of thin plate sections; and a hole formed by both inner walls of said pair of thin plate sections, an inner wall of said movable section, and an inner wall of said fixation section, said method comprising the steps of:

producing a ceramic substrate having said thin plate sections and said hole;

forming said one or more piezoelectric/electrostrictive elements on at least one of said thin plate sections; and cutting off a predetermined portion after forming said piezoelectric/electrostrictive element on at least said thin plate section to produce said piezoelectric/electrostrictive device in which at least one thin plate section of said pair of thin plate sections is previously bent in a direction to make mutual approach.

2. A method for producing a piezoelectric/electrostrictive device comprising:

a pair of mutually opposing thin plate sections, a movable section, and a fixation section for supporting said thin plate sections and said movable section;

one or more piezoelectric/electrostrictive elements arranged on at least one thin plate section of said pair of thin plate sections; and a hole formed by both inner walls of said pair of thin plate sections, an inner wall of said movable section, and an inner wall of said fixation section, said method comprising the step of:

cutting off a predetermined portion after forming said piezoelectric/electrostrictive element on at least said thin plate section to produce said piezoelectric/electrostrictive device in which at least one thin plate section of said pair of thin plate sections is previously bent in a direction to make mutual approach.

3. A method for producing a piezoelectric/electrostrictive device comprising:

a pair of mutually opposing thin plate sections, a movable section, and a fixation section for supporting said thin plate sections and said movable section;

one or more piezoelectric/electrostrictive elements arranged on at least one thin plate section of said pair of thin plate sections; and a hole formed by both inner walls of said pair of thin plate sections, an inner wall of said movable section, and an inner wall of said fixation section, said method comprising the step of:

cutting off a predetermined portion after forming said piezoelectric/electrostrictive element on at least said thin plate section to produce said piezoelectric/electrostrictive device in which said pair of thin plate sections are previously bent in directions to make mutual approach.

4. A method for producing a piezoelectric/electrostrictive device comprising:

a pair of mutually opposing thin plate sections, a movable section, and a fixation section for supporting said thin plate sections and said movable section;

one or more piezoelectric/electrostrictive elements arranged on at least one thin plate section of said pair of thin plate sections; and a hole formed by both inner walls of said pair of thin plate sections, an inner wall of said movable section, and an inner wall of said fixation section, said method comprising the steps of:

integrally sintering a ceramic green laminate including at least a first ceramic green sheet having a window for forming at least said hole and second ceramic green sheets to be formed into said thin plate sections to produce a ceramic laminate including portions to be formed into said thin plate sections denting inwardly;

forming said piezoelectric/electrostrictive element on at least an outer surface of a portion of said ceramic laminate to be formed into said thin plate section; and producing a ceramic substrate formed with at least said piezoelectric/electrostrictive element in which said pair of thin plate sections are bent in directions to make mutual approach, by means of at least a one time cutoff treatment of at least a portion of said ceramic laminate formed with said piezoelectric/electrostrictive element.

5. The method for producing said piezoelectric/electrostrictive device according to claim 4, wherein said first and second ceramic green sheets have a difference in sintering shrinkage speed and/or sintering shrinkage amount.

6. The method for producing said piezoelectric/electrostrictive device according to claim 4, wherein:

said step of forming said piezoelectric/electrostrictive element is performed in accordance with a film formation method; and at least any one of a pair of electrodes and/or a piezoelectric/electrostrictive layer is integrated by sintering with at least said outer surface of said portion to be formed into said thin plate section.

7. The method for producing said piezoelectric/electrostrictive device according to claim 4, further comprising the step of exposing said hole by means of a cutoff treatment of at least a portion of said ceramic laminate.

* * * * *